(12) United States Patent
Domon et al.

(10) Patent No.: US 9,329,476 B2
(45) Date of Patent: May 3, 2016

(54) CHEMICALLY AMPLIFIED NEGATIVE RESIST COMPOSITION AND PATTERNING PROCESS

(71) Applicant: SHIN-ETSU CHEMICAL CO., LTD., Tokyo (JP)

(72) Inventors: Daisuke Domon, Joetsu (JP); Keiichi Masunaga, Joetsu (JP); Satoshi Watanabe, Joetsu (JP); Masaki Ohashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/586,120

(22) Filed: Dec. 30, 2014

(65) Prior Publication Data

US 2015/0198877 A1    Jul. 16, 2015

(30) Foreign Application Priority Data

Jan. 10, 2014   (JP) .................. 2014-003245

(51) Int. Cl.
| G03F 7/004 | (2006.01) |
| G03F 7/26 | (2006.01) |
| G03F 7/027 | (2006.01) |
| G03F 7/038 | (2006.01) |
| G03F 7/30 | (2006.01) |
| G03F 7/20 | (2006.01) |
| G03F 1/50 | (2012.01) |

(52) U.S. Cl.
CPC .............. *G03F 7/027* (2013.01); *G03F 7/0045* (2013.01); *G03F 7/0046* (2013.01); *G03F 7/0382* (2013.01); *G03F 7/0388* (2013.01); *G03F 7/2002* (2013.01); *G03F 7/2037* (2013.01); *G03F 7/30* (2013.01); *G03F 1/50* (2013.01); *G03F 7/26* (2013.01)

(58) Field of Classification Search
CPC ....... G03F 1/50; G03F 7/0045; G03F 7/0382; G03F 7/26
USPC ........... 430/5, 270.1, 325, 910, 914, 925, 942
See application file for complete search history.

(56) References Cited

U.S. PATENT DOCUMENTS

| 6,235,447 | B1 * | 5/2001 | Lee .................. C07C 62/34 430/270.1 |
| 8,835,097 | B2 * | 9/2014 | Domon ............... G03F 7/0045 430/270.1 |
| 2001/0036589 | A1 | 11/2001 | Kinoshita et al. |
| 2001/0041300 | A1 | 11/2001 | Kodama et al. |
| 2002/0051933 | A1 | 5/2002 | Kodama et al. |
| 2002/0192592 | A1 | 12/2002 | Yasunami et al. |
| 2004/0260031 | A1 | 12/2004 | Takeda et al. |
| 2005/0238992 | A1 * | 10/2005 | Kodama .............. G03F 7/0045 430/270.1 |
| 2006/0166133 | A1 | 7/2006 | Koitabashi et al. |
| 2008/0096128 | A1 | 4/2008 | Takeda et al. |
| 2008/0118860 | A1 | 5/2008 | Harada et al. |
| 2008/0241751 | A1 | 10/2008 | Takeda et al. |
| 2009/0069521 | A1 | 3/2009 | Nagai et al. |
| 2011/0212390 | A1 | 9/2011 | Masunaga et al. |
| 2011/0294047 | A1 | 12/2011 | Koitabashi et al. |
| 2012/0288796 | A1 | 11/2012 | Katayama et al. |

FOREIGN PATENT DOCUMENTS

| JP | H11-327143 A | 11/1999 |
| JP | 2002-278068 A | 9/2002 |
| JP | 2004-115630 A | 4/2004 |
| JP | 2005-008766 A | 1/2005 |
| JP | 2006-201532 A | 8/2006 |
| JP | 2006-215180 A | 8/2006 |
| JP | 3955384 B2 | 8/2007 |
| JP | 2008-102383 A | 5/2008 |
| JP | 2008-111103 A | 5/2008 |
| JP | 2008-112186 A | 5/2008 |
| JP | 4116340 B2 | 7/2008 |
| JP | 2008-249762 A | 10/2008 |

(Continued)

OTHER PUBLICATIONS

Jul. 15, 2015 Office Action in Taiwanese Patent Application No. 104100353.
Jul. 15, 2015 Search Report issued in Taiwanese Patent Application No. 104100353.

*Primary Examiner* — John S Chu
(74) *Attorney, Agent, or Firm* — Oliff PLC

(57) ABSTRACT

The present invention provides the chemically amplified negative resist composition comprises an onium salt represented by the following general formula (0-1), a resin which becomes alkali insoluble by an action of an acid and an acid generator,

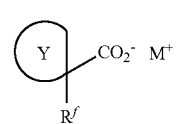

(0-1)

wherein $R^f$ represents a fluorine atom or a trifluoromethyl group; Y represents a cyclic hydrocarbon group having 3 to 30 carbon atoms, the hydrogen atom in the cyclic hydrocarbon group may be substituted by a hetero atom itself or a monovalent hydrocarbon group which may be substituted by a hetero atom(s), and the hetero atom(s) may be interposed into the cyclic structure of the cyclic hydrocarbon group and the monovalent hydrocarbon group; and $M^+$ represents a monovalent cation. There can be provided a chemically amplified negative resist composition which can improve resolution at the time of forming a pattern and give a pattern with less line edge roughness (LER).

20 Claims, No Drawings

(56) References Cited

FOREIGN PATENT DOCUMENTS

| JP | 2008-304590 | A  | 12/2008 |
| JP | 4226803 | B2 | 2/2009 |
| JP | 4231622 | B2 | 3/2009 |
| TW | 201142503 | A1 | 12/2011 |
| TW | 201302806 | A1 | 1/2013 |
| WO | 2006/121096 | A1 | 11/2006 |

* cited by examiner

CHEMICALLY AMPLIFIED NEGATIVE RESIST COMPOSITION AND PATTERNING PROCESS

BACKGROUND OF THE INVENTION

1. Field of the Invention

The present invention relates to a chemically amplified negative resist composition to be used for processing of a semiconductor or photomask blanks, etc., and a resist patterning process using the same.

2. Description of the Related Art

In recent years, as an integrated circuit progresses toward a higher integration, a finer circuit pattern profile has been required. Among these, a chemically amplified resist using an acid as a catalyst has been exclusively used in the patterning process of the size of 0.2 µm or less. Also, a high-energy beam such as ultraviolet beam, far ultraviolet beam, an electron beam, etc., has been used as an light source at this time, in particular, an electron beam lithography which has been utilized as an ultrafine processing technology is indispensable as a processing method of a photomask blank when a photomask for a semiconductor manufacturing is to be produced.

A polymer containing a large amount of aromatic skeletons having an acidic side chain, for example, a polyhydroxystyrene, has been utilized as a resist composition for KrF excimer laser, but it shows remarkable absorption in wavelength of near 200 nm of the light, so that it has been never used as a resist composition for ArF excimer laser. However, it is an important material in the point that high etching resistance can be obtained as a resist composition for an electron beam or a resist composition for extreme ultraviolet (EUV), which is a useful technology for forming a smaller pattern than the processing limit by ArF excimer laser.

As such a resist composition to be used for photolithography, there are a positive type in which an exposed area is dissolved to form a pattern and a negative type in which an exposed area is remained to form a pattern, and a type which can be used easier is selected depending on the form of the resist pattern to be required. The chemically amplified negative resist composition generally contains a polymer which is dissolved in an aqueous alkaline developer, an acid generator which is decomposed by exposure light to generate an acid and a crosslinking agent which forms crosslinking between polymers using an acid as a catalyst to insolubilize the polymer in the above-mentioned developer (in some cases, the polymer and the crosslinking agent are integrated), and a basic compound to control diffusion of the acid generated by the exposure is further added in general.

As the alkali soluble unit constituting the polymer which is dissolved in the above-mentioned aqueous alkaline developer, a type of using a phenol unit may be mentioned. In the prior art, a large number of such a type of the negative resist compositions have been developed particularly for exposure by KrF excimer laser beam. However, a phenol unit thereof does not have light transmittance when the exposure light has a wavelength of 150 to 220 nm, so that these have not been used as a composition for the ArF excimer laser beam. But in recent years, it has been attracted attention again as a negative resist composition for exposure light of a short wavelength such as an electron beam (EB) and EUV which is an exposure method for obtaining a finer pattern, and, for example, Patent Document 1, Patent Document 2 and Patent Document 3 have been reported.

By the way, in the above-mentioned photolithography, for the purpose of controlling resist sensitivity or pattern profile, various improvements by selection or combination of the materials used for the resist composition, and modification of the processing conditions, etc., have been investigated. As one of the focuses on the improvement, there is a problem of diffusion of an acid which causes important effect on resolution of the chemically amplified resist.

An acid diffusion controlling agent is a material to suppress acid diffusion, and is in fact an essential component to improve performances of the resist, in particular resolution. Various investigations have been done on the acid diffusion controlling agent, and amines or weak acid onium salts have generally been used. As an example of the weak acid onium salt, in Patent Document 4, it has been disclosed that good resist pattern can be formed without forming T-top, difference in line widths between isolated pattern and dense pattern, and standing wave by adding a triphenyl-sulfonium=acetate. In Patent Document 5, it has been stated that sensitivity, resolution and exposure margin have been improved by the addition of a sulfonic acid ammonium salt or a carboxylic acid ammonium salt. Also, in Patent Document 6, it has been stated that a resist composition for KrF and an electron beam comprising a combination containing a photoacid generator which generates a fluorine-containing carboxylic acid is excellent in resolution, and process admissibility such as exposure margin, depth of focus, etc., have been improved. Further, in Patent Document 7, it has been also stated that a resist composition for $F_2$ laser light comprising a combination containing a photoacid generator which generates a fluorine-containing carboxylic acid is excellent in line edge roughness (LER), and a problem of footing profile has been overcome. Whereas the proposals of the above-mentioned four documents relate to the compositions used for KrF, an electron beam and $F_2$ lithography, in Patent Document 8, a positive photosensitive composition for ArF excimer laser exposure containing a carboxylic acid onium salt has been disclosed. These are to suppress the acid decomposition reaction of the acid-labile group and make the acid diffusion distance small (to control) by exchanging a strong acid (sulfonic acid) generated from the other photoacid generator by exposure with weak acid onium salt to form a weak acid and a strong acid=onium salt so that a strong acid (sulfonic acid) having high acidity is exchanged to a weak acid (carboxylic acid), and thus, it apparently acts as an acid diffusion controlling agent.

However, when patterning is carried out by using the above-mentioned resist composition containing a carboxylic acid onium salt or a fluorocarboxylic acid onium salt, it involves the problem that LER is large, so that development of an acid diffusion controlling agent which can reduce LER has been desired.

PRIOR ART DOCUMENTS

Patent Documents

[Patent Document 1] Japanese Patent Laid-Open Publication No. 2006-201532

[Patent Document 2] Japanese Patent Laid-Open Publication No. 2006-215180

[Patent Document 3] Japanese Patent Laid-Open Publication No. 2008-249762

[Patent Document 4] Japanese Patent No. 3955384

[Patent Document 5] Japanese Patent Laid-Open Publication No. H11-327143

[Patent Document 6] Japanese Patent No. 4231622

[Patent Document 7] Japanese Patent No. 4116340

[Patent Document 8] Japanese Patent No. 4226803

SUMMARY OF THE INVENTION

The present invention has been accomplished in view of the above-mentioned circumstances, and an object thereof is to provide a chemically amplified negative resist composition improved in resolution at the time of forming a pattern, and can give a pattern reduced in line edge roughness (LER).

To solve the above-mentioned problems, the present invention is to provide a chemically amplified negative resist composition comprising an onium salt represented by the following general formula (0-1), a resin which becomes alkali insoluble by an action of an acid, and an acid generator,

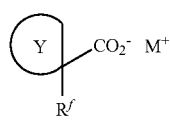

(0-1)

wherein $R^f$ represents a fluorine atom or a trifluoromethyl group; Y represents a cyclic hydrocarbon group having 3 to 30 carbon atoms, the hydrogen atom in the cyclic hydrocarbon group may be substituted by a hetero atom itself or a monovalent hydrocarbon group which may be substituted by a hetero atom(s), and the hetero atom(s) may be interposed into the cyclic structure of the cyclic hydrocarbon group and the monovalent hydrocarbon group; and $M^+$ represents a monovalent cation.

When such a chemically amplified negative resist composition is employed, acid diffusion can be effectively controlled by the action of the onium salt contained therein, so that when it is formed as a resist film and a pattern is formed, a pattern having good resolution and reduced in LER can be obtained.

Among these, the above-mentioned onium salt is preferably a compound represented by the following general formula (1) or (2),

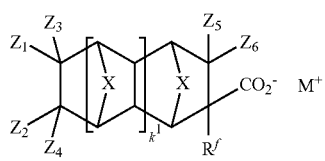

(1)

wherein $R^f$ and $M^+$ have the same meanings as defined above; X represents O or $CH_2$; $k^1$ represents an integer of 0 to 2; and each $Z^1$, $Z^2$, $Z^3$, $Z^4$, $Z^5$ and $Z^6$ independently represent a hydrogen atom or a linear, branched or cyclic monovalent hydrocarbon group having 1 to 10 carbon atoms which may be substituted by a hetero atom(s), and a hetero atom(s) may be interposed in the monovalent hydrocarbon group,

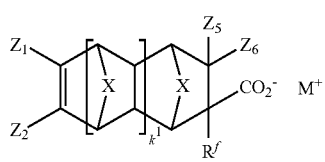

(2)

wherein $R^f$, X, $k^1$, $Z^1$, $Z^2$, $Z^5$, $Z^6$ and $M^+$ have the same meanings as defined above.

When such a chemically amplified negative resist composition is employed, resolution at the time of forming a pattern can be more improved, and preparing thereof becomes easy since the onium salt can be well handled.

Among them, the resin preferably contains a repeating unit represented by the following general formula (3) or a repeating unit represented by the following general formula (4), or both of them,

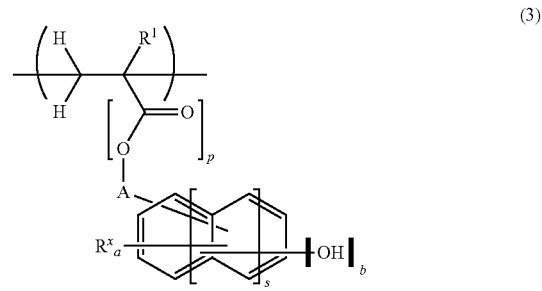

(3)

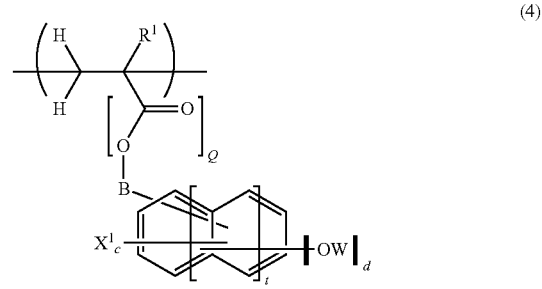

(4)

wherein each A and B represent a single bond or an alkylene group having 1 to 10 carbon atoms which may contain an ether bond(s) in the chain of the alkylene group; each $R^1$ independently represents a hydrogen atom or a methyl group; each $R^x$ independently represents a hydrogen atom or an alkyl group having 1 to 6 carbon atoms; X' represents a hydrogen atom, a linear, branched or cyclic alkyl group having 1 to 20 carbon atoms, an alkoxyalkyl group having 2 to 20 carbon atoms, an alkylthioalkyl group having 2 to 20 carbon atoms, a halogen atom, a nitro group, a cyano group, a sulfinyl group or a sulfonyl group; W represents an alkyl group having 1 to 20 carbon atoms or an acyl group having 1 to 20 carbon atoms; "a" and "c" represent integers of 0 to 4; "b" represents an integer of 1 to 5; "d" represents an integer of 0 to 5; each P and Q represent 0 or 1; and each "s" and "t" represent an integer of 0 to 2.

When such a chemically amplified negative resist composition is employed, adhesion to a workpiece when it is formed as a resist film can be improved by the action of the above-mentioned repeating unit, and solubility in an alkaline developer can be controlled.

Also, the above-mentioned resin preferably contains a repeating unit represented by the following general formula (5) or a repeating unit represented by the following general formula (6), or both of them,

(5)

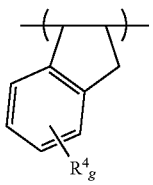

(6)

wherein "f" represents an integer of 0 to 6; each $R^3$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s); "g" represents an integer of 0 to 4; each $R^4$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s).

When such a chemically amplified negative resist composition is employed, etching selectivity to the workpiece at the time of forming a pattern can be improved by the action of the above-mentioned repeating unit.

Further, the above-mentioned chemically amplified negative resist composition preferably contains a crosslinking agent.

When such a chemically amplified negative resist composition is employed, the crosslinking reaction of the resin in the exposed area can be promoted at the time of forming a pattern, and a negative pattern can be obtained more easily at the time of forming a pattern.

Further, the above-mentioned chemically amplified negative resist composition preferably contains one or more basic compounds represented by the following general formulae (7) to (9),

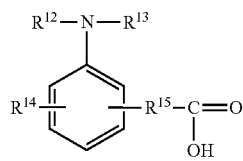

(7)

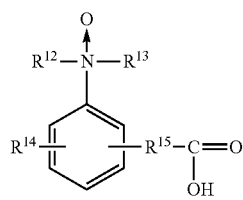

(8)

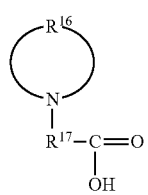

(9)

wherein each $R^{12}$ and $R^{13}$ represent a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, or $R^{12}$ and $R^{13}$ may be bonded to form a cyclic structure with the nitrogen atom to which they are bonded; $R^{14}$ represents a hydrogen atom, a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, branched or cyclic alkylene group having 1 to 20 carbon atoms, or an arylene group having 6 to 20 carbon atoms; $R^{16}$ represents a linear or branched alkylene group having 2 to 20 carbon atoms which may be substituted, and the alkylene group may contain one or a plural number of a carbonyl group(s), an ether group(s), an ester group(s) and a sulfide bond(s) between carbon-carbon bond of the alkylene group; and $R^{17}$ represents a linear, branched or cyclic alkylene group having 1 to 20 carbon atoms, or an arylene group having 6 to 20 carbon atoms.

When such a chemically amplified negative resist composition is employed, acid diffusion can be more effectively controlled, and generation of undercut of the pattern can be effectively suppressed.

The present invention also provides
a patterning process which comprises the steps of forming a resist film on a workpiece using the above-mentioned chemically amplified negative resist composition, irradiating a high energy beam to the resist film, and developing the resist film after irradiation using an alkaline developer to obtain a resist pattern.

When such a patterning process is employed, acid diffusion at the time of exposure can be effectively controlled by the action of the onium salt contained in the chemically amplified negative resist composition, so that a pattern with good resolution and reduced in LER can be formed onto the resist film.

At this time, EUV or an electron beam is preferably used as the above-mentioned high-energy beam.

When such a patterning process is employed, finer pattern can be formed onto the resist film.

In addition, a substrate having a layer containing chromium at the outermost layer is preferably used as the above-mentioned workpiece.

Further, a photomask blank is preferably used as the above-mentioned workpiece.

Thus, when the patterning process of the present invention is employed, even when a workpiece (for example, photomask blank) having an outermost layer which likely influences a pattern profile of the chemically amplified resist such as a layer at the outermost containing chromium, etc., is used, a resist film excellent in adhesion can be obtained, and a pattern reduced in line edge roughness can be formed by exposure.

The chemically amplified negative resist composition of the present invention can control acid diffusion effectively when the composition is exposed, and a pattern having extremely high resolution and reduced in LER can be obtained at the time of forming the pattern by the action of the onium salt contained therein. Also, when such a patterning process using the chemically amplified negative resist composition is employed, a pattern having high resolution with reduced LER can be formed, so that it can be suitably used for microprocessing technology, in particular, for an electron beam and EUV lithography technology.

DETAILED DESCRIPTION OF THE PREFERRED EMBODIMENTS

In the following, the present invention is explained in more specifically.

The present inventors have studied to accomplish the above-mentioned problems, and as a result, they have found that a pattern with less LER can be obtained when an onium salt into which a fluorine atom or a trifluoromethyl group is introduced at an appropriate position of a carboxylic acid onium salt is added to a negative resist composition, whereby the present invention has been completed.

In the following, the present invention is explained in more detail.

Incidentally, in the following explanation, there exists an asymmetric carbon depending on the structure represented by the chemical general formula, so that an enantio isomer (enantiomer) or a diastereo isomer (diastereomer) can exist in some cases, and in such a case, these isomers are represented by one general formula as a representative. These isomers may be used alone, or may be used as a mixture.

[Chemically Amplified Negative Resist Composition]

The present invention relates to a chemically amplified negative resist composition comprising an onium salt represented by the following general formula (0-1), a resin which becomes alkali insoluble by an action of an acid and an acid generator,

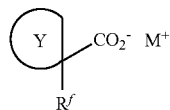

(0-1)

wherein $R^f$ represents a fluorine atom or a trifluoromethyl group; Y represents a cyclic hydrocarbon group having 3 to 30 carbon atoms, the hydrogen atom in the cyclic hydrocarbon group may be substituted by a hetero atom itself or a monovalent hydrocarbon group which may be substituted by a hetero atom(s), and the hetero atom(s) may be interposed into the cyclic structure of the cyclic hydrocarbon group and the monovalent hydrocarbon group; and $M^+$ represents a monovalent cation.

Preferred embodiment of the onium salt to be contained in the chemically amplified negative resist composition of the present invention is an onium salt represented by the following general formula (1) or (2),

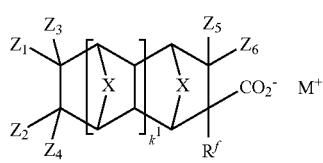

(1)

wherein $R^f$ and $M^+$ have the same meanings as defined above; X represents O or $CH_2$; $k^1$ represents an integer of 0 to 2; and each $Z^1$, $Z^2$, $Z^3$, $Z^4$, $Z^5$ and $Z^6$ independently represent a hydrogen atom or a linear, branched or cyclic monovalent hydrocarbon group having 1 to 10 carbon atoms which may be substituted by a hetero atom(s), and a hetero atom(s) may be interposed in the monovalent hydrocarbon group,

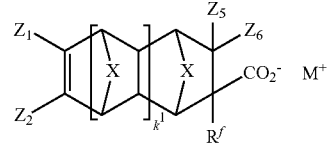

(2)

wherein $R^f$, X, $k^1$, $Z^1$, $Z^2$, $Z^5$, $Z^6$ and $M^+$ have the same meanings as defined above.

$M^+$ in the above-mentioned general formula (0-1), (1) and (2) represents a monovalent cation. The monovalent cation is not particularly limited, and may be mentioned a sulfonium cation represented by the following general formula (10),

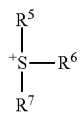

(10)

wherein each $R^5$, $R^6$ and $R^7$ independently represent a substituted or unsubstituted, linear or branched alkyl group, alkenyl group or oxoalkyl group each having 1 to 10 carbon atoms, or a substituted or unsubstituted aryl group, aralkyl group or aryloxoalkyl group each having 6 to 18 carbon atoms, and two or more of $R^5$, $R^6$ and $R^7$ may be bonded to each other to form a ring with the sulfur atom in the formula.

The above-mentioned alkyl group may be specifically mentioned a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, etc. The alkenyl group may be mentioned a vinyl group, an allyl group, a propenyl group, a butenyl group, a hexenyl group, a cyclohexenyl group, etc. The oxoalkyl group may be mentioned a 2-oxocyclopentyl group, a 2-oxocyclohexyl group, a 2-oxopropyl group, a 2-oxoethyl group, a 2-cyclopentyl-2-oxoethyl group, a 2-cyclohexyl-2-oxoethyl group, a 2-(4-methylcyclohexyl)-2-oxoethyl group, etc.

In addition, the aryl group may be mentioned a phenyl group, a naphthyl group, a thienyl group, etc., an alkoxyphenyl group such as a 4-hydroxyphenyl group, a 4-methoxyphenyl group, a 3-methoxyphenyl group, a 2-methoxyphenyl group, a 4-ethoxyphenyl group, a 4-tert-butoxyphenyl group, a 3-tert-butoxyphenyl group, etc., an alkylphenyl group such as a 2-methylphenyl group, a 3-methylphenyl group, a 4-methylphenyl group, a 4-ethylphenyl group, a 4-tert-butylphenyl group, a 4-n-butylphenyl group, a 2,4-dimethylphenyl group, etc., an alkylnaphthyl group such as a methylnaphthyl group, an ethylnaphthyl group, etc., an alkoxynaphthyl group such as a methoxynaphthyl group, an ethoxynaphthyl group, etc., a dialkylnaphthyl group such as a dimethylnaphthyl group, a diethylnaphthyl group, etc., and a dialkoxynaphthyl group such as a dimethoxynaphthyl group, a diethoxynaphthyl group, etc. The aralkyl group may be mentioned a benzyl group, a 1-phenylethyl group, a 2-phenylethyl group, etc. The aryloxoalkyl group may be mentioned a 2-aryl-2-oxoethyl group such as a 2-phenyl-2-oxoethyl group, a 2-(1-naphthyl)-2-oxoethyl group, a 2-(2-naphthyl)-2-oxoethyl group, etc.

Also, when two or more of $R^5$, $R^6$ and $R^7$ are bonded to each other form a ring with the sulfur atom in the formula, the group forming these cyclic structures may be mentioned a divalent organic group such as 1,4-butylene, 3-oxa-1,5-pentylene, etc. Further, there may be mentioned an aryl group having a polymerizable substituent(s) such as an acryloyloxy group, a methacryloyloxy group, etc., as a substituent(s), and specifically mentioned a 4-acryloyloxyphenyl group, a 4-methacryloyloxyphenyl group, a 4-acryloyloxy-3,5-dimethylphenyl group, a 4-methacryloyloxy-3,5-dimethylphenyl group, a 4-vinyloxyphenyl group, a 4-vinylphenyl group, etc.

The above-mentioned sulfonium cation may be specifically mentioned triphenyl sulfonium, 4-hydroxy-phenyl-diphenyl sulfonium, bis(4-hydroxyphenyl)phenyl sulfonium, tris(4-hydroxyphenyl)sulfonium, 4-tert-butoxyphenyldiphenyl sulfonium, bis(4-tert-butoxyphenyl)phenyl sulfonium, tris(4-tert-butoxyphenyl)sulfonium, 3-tert-butoxyphenyl-diphenyl sulfonium, bis(3-tert-butoxyphenyl)phenyl sulfonium, tris(3-tert-butoxyphenyl)sulfonium, 3,4-di-tert-butoxyphenyldiphenyl sulfonium, bis(3,4-di-tert-butoxyphenyl)phenyl sulfonium, tris(3,4-di-tert-butoxyphenyl)sulfonium, diphenyl(4-thiophenoxyphenyl)sulfonium, 4-tert-butoxycarbonylmethyloxyphenyldiphenyl sulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenyl sulfonium, (4-hydroxy-3,5-dimethylphenyl)diphenyl sulfonium, (4-n-hexyloxy-3,5-dimethylphenyl)diphenyl sulfonium, dimethyl(2-naphthyl)sulfonium, 4-hydroxyphenyldimethyl sulfonium, 4-methoxyphenyldimethyl sulfonium, trimethyl sulfonium, 2-oxocyclohexylcyclohexylmethyl sulfonium, trinaphthyl sulfonium, tribenzyl sulfonium, diphenylmethyl sulfonium, dimethylphenyl sulfonium, 5-phenyldibenzothiophenium, 10-phenylphenoxathiinium, 2-oxo-2-phenylethylthiacyclopentanium, diphenyl2-thienyl sulfonium, 4-n-butoxynaphthyl-1-thiacyclopentanium, 2-n-butoxynaphthyl-1-thiacyclopentanium, 4-methoxynaphthyl-1-thiacyclopentanium, 2-methoxynaphthyl-1-thiacyclopentanium, 4-methylphenyldiphenyl sulfonium, 4-ethylphenyldiphenyl sulfonium, 4-tert-butylphenyldiphenyl sulfonium, 4-cyclo-hexylphenyldiphenyl sulfonium, 4-n-hexylphenyldiphenyl sulfonium, 4-n-octylphenyldiphenyl sulfonium, 4-methoxy-phenyl-diphenyl sulfonium, 4-ethoxyphenyldiphenyl sulfonium, 4-tert-butoxyphenyldiphenyl sulfonium, 4-cyclohexyloxyphenyldiphenyl sulfonium, 4-n-hexyloxyphenyldiphenyl sulfonium, 4-n-octyloxyphenyldiphenyl sulfonium, 4-dodecyl-oxyphenyldiphenyl sulfonium, 4-trifluoromethylphenyldiphenyl sulfonium, 4-trifluoromethyloxyphenyldiphenyl sulfonium, 4-tert-butoxycarbonylmethyloxyphenyldiphenyl sulfonium, 4-methacryloyloxyphenyldiphenyl sulfonium, 4-acryloyloxyphenyldiphenyl sulfonium, (4-n-hexyloxy-3,5-dimethylphenyl)diphenylsulfonium, (4-methacryloyloxy-3,5-dimethylphenyl)diphenyl sulfonium, (4-acryloyloxy-3,5-dimethylphenyl)diphenylsulfonium, etc.

It is more preferably mentioned triphenyl sulfonium, 4-tert-butylphenyldiphenyl sulfonium, 4-tert-butoxyphenyldiphenyl sulfonium, tris(4-tert-butylphenyl)sulfonium, 4-tert-butoxycarbonylmethyloxyphenyldiphenyl sulfonium, 4-methacryloyloxyphenyldiphenyl sulfonium, 4-acryloyloxyphenyldiphenyl sulfonium, 4-methacryloyloxyphenyldimethyl sulfonium, 4-acryloyloxyphenyldimethyl sulfonium, (4-methacryloyloxy-3,5-dimethylphenyl)diphenyl sulfonium, (4-acryloyloxy-3,5-dimethylphenyl)diphenylsulfonium, etc.

Also, the monovalent cation represented by $M^+$ in the above-mentioned general formulae (0-1), (1) and (2) may be mentioned, other than the sulfonium cation, an iodonium cation and an ammonium cation, etc.

More specific iodonium cation may be exemplified by diphenyliodonium, bis(4-methylphenyl)iodonium, bis(4-(1,1-dimethylethyl)phenyl)iodonium, bis(4-(1,1-dimethylpropyl)phenyl)iodonium, (4-(1,1-dimethylethoxy)phenyl)phenyliodonium, etc., and the ammonium cation may be exemplified by a tertiary ammonium salt such as a salt of trimethylammonium, triethylammonium, tributylammonium, N,N-dimethyl-anilinium, etc., or a quaternary ammonium salt such as a salt of tetramethylammonium, tetraethylammonium, tetrabutylammonium, etc.

In the above-mentioned general formulae (1) and (2), each $Z^1$, $Z^2$, $Z^3$, $Z^4$, $Z^5$ and $Z^6$ independently represent a hydrogen atom or a linear, branched or cyclic monovalent hydrocarbon group having 1 to 10 carbon atoms which may be substituted by a hetero atom(s), and a hetero atom(s) may be interposed in the monovalent hydrocarbon group. Such a monovalent hydrocarbon group may be specifically exemplified by a methyl group, an ethyl group, a propyl group, an isopropyl group, a n-butyl group, a sec-butyl group, a tert-butyl group, a tert-amyl group, a n-pentyl group, a n-hexyl group, a n-octyl group, a n-nonyl group, a n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, an oxanorbornyl group, a tricyclo[5.2.1.0$^{2,6}$]decanyl group, an adamantyl group, etc. Also, a part of the hydrogen atom(s) of these groups may be substituted by a hetero atom(s) such as an oxygen atom, a sulfur atom, a nitrogen atom, a halogen atom, etc., or a hetero atom(s) such as an oxygen atom, a sulfur atom, a nitrogen atom, etc., may be interposed therebetween. That is, they may form or may be interposed by a hydroxyl group, a cyano group, a carbonyl group, an ether bond, an ester bond, a sulfonate ester bond, a carbonate bond, a lactone ring, a sultone ring, a carboxylic acid anhydride, a haloalkyl group, etc.

Preferred specific examples of the carboxylic acid anion in the above-mentioned general formula (1) or (2) are shown below.

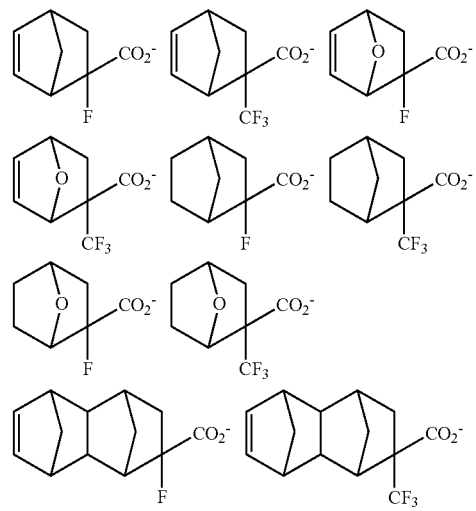

-continued

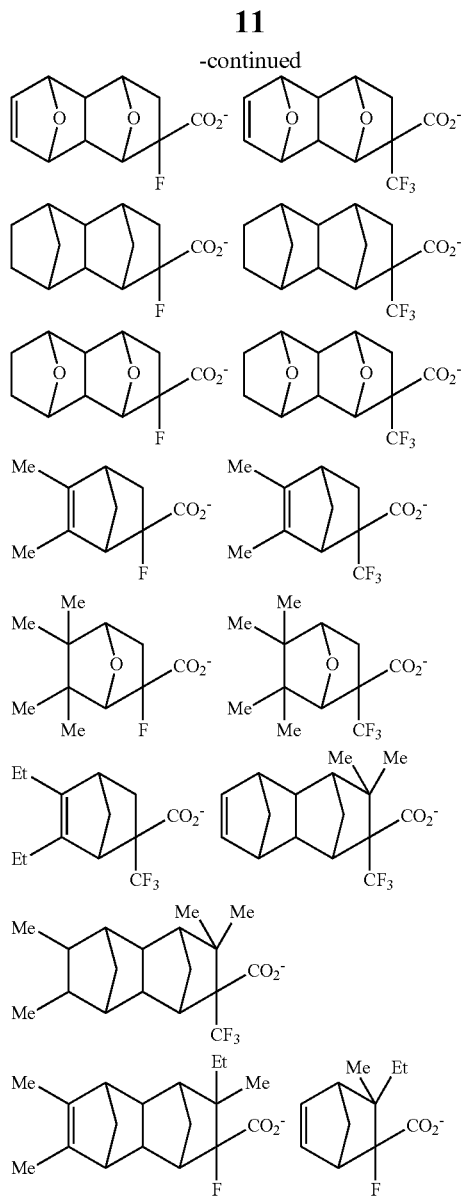

A method for obtaining the onium salt represented by the above-mentioned general formula (2) is exemplified by the following reaction scheme, but the invention is not limited by these.

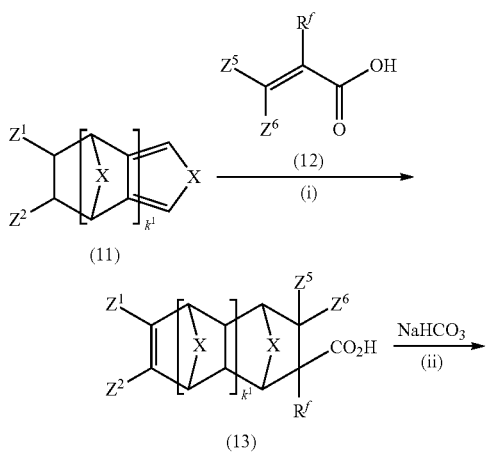

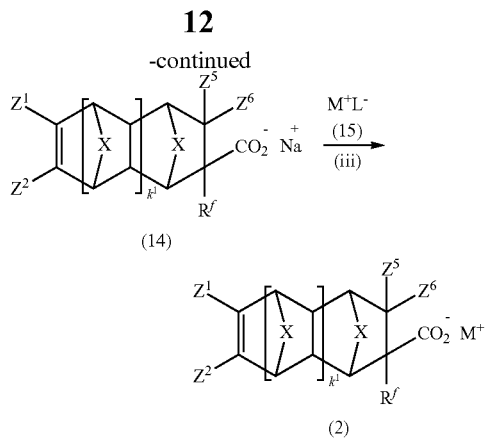

wherein $R^f$, X, $k^1$, $Z^1$, $Z^2$, $Z^5$, $Z^6$ and $M^+$ have the same meanings as defined above; and $L^-$ represents a halide ion or methyl sulfate ion.

The step (i) in the above-mentioned scheme is a step to give a carboxylic acid (13) by the Diels-Alder reaction of a diene (11) and a fluorinated acrylic acid (12). The reaction may be preferably carried out without solvent or in a solvent such as methylene chloride, toluene, hexane, diethyl ether, tetrahydrofuran, acetonitrile, etc., by mixing the diene (11) and the fluorinated acrylic acid (12), under cooling or heating, if necessary.

The step (ii) is a step to convert the carboxylic acid (13) to a sodium salt (14). The solvent which can be used for the reaction may be mentioned water, ethers such as tetrahydrofuran, diethyl ether, diisopropyl ether, di-n-butyl ether, 1,4-dioxane, etc., hydrocarbons such as n-hexane, n-heptane, benzene, toluene, xylene, etc., aprotic polar solvents such as acetonitrile, dimethylsulfoxide (DMSO), N,N-dimethylformamide (DMF), etc., chlorinated organic solvents such as methylene chloride, chloroform, carbon tetrachloride, etc. These solvents may be used by optionally selecting depending on the reaction conditions, and may be used one kind alone or two or more kinds in admixture. The reaction may be preferably carried out in the above-mentioned solvent by mixing the carboxylic acid (13) and sodium hydrogen carbonate, under cooling or heating, if necessary.

The step (iii) is a step of obtaining an objective onium salt (2) by an ion-exchange reaction of the sodium salt of a carboxylic acid (14) and an onium salt (15). The solvent which can be used for the reaction may be mentioned water, ethers such as tetrahydrofuran, diethyl ether, diisopropyl ether, di-n-butyl ether, 1,4-dioxane, etc., hydrocarbons such as n-hexane, n-heptane, benzene, toluene, xylene, etc., aprotic polar solvents such as acetonitrile, dimethylsulfoxide (DMSO), N,N-dimethylformamide (DMF), etc., chlorinated organic solvents such as methylene chloride, chloroform, carbon tetrachloride, etc. These solvents may be used by optionally selecting depending on the reaction conditions, and may be used one kind alone or two or more kinds in admixture. The reaction may be preferably carried out in the above-mentioned solvent by mixing the carboxylic acid salt (14) and the onium salt (15), under cooling or heating, if necessary. The objective onium salt (2) can be obtained from the reaction mixture by the usual post-treatment of the aqueous system (aqueous work-up), and can be purified by the conventional method such as recrystallization, chromatography, etc., if necessary.

A method for obtaining the onium salt represented by the general formula (1') in which $Z^3$ and $Z^4$ in the above-mentioned general formula (1) are hydrogen atoms is exemplified by the following reaction scheme, but the invention is not limited by these,

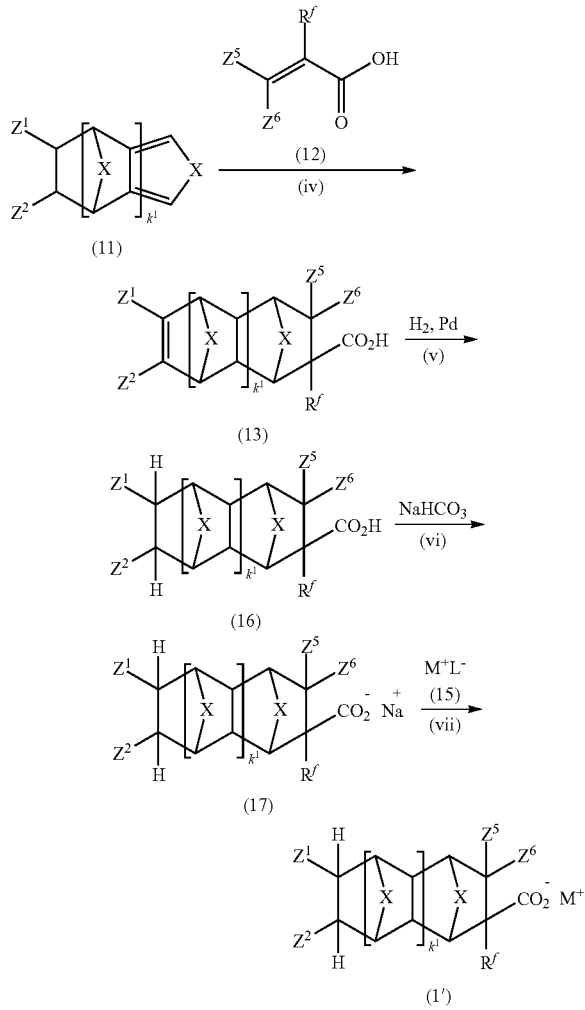

wherein $R^f$, $X$, $k^1$, $Z^1$, $Z^2$, $Z^5$, $Z^6$, $M^+$ and $L^-$ have the same meanings as defined above.

The above-mentioned step (iv) is the same as the step (i) in the scheme for obtaining the onium salt represented by the above-mentioned general formula (2).

The above-mentioned step (v) is a step to obtain a carboxylic acid (16) by hydrogenating the double bond of the carboxylic acid (13) by hydrogenation reaction. The reaction may be preferably carried out without solvent or in a solvent such as methylene chloride, methanol, toluene, hexane, diethyl ether, tetrahydrofuran, acetonitrile, etc., by mixing a palladium catalyst and the carboxylic acid (13), and stirring the same under hydrogen atmosphere. In addition, it may be carried out under cooling or heating, if necessary.

The above-mentioned steps (vi) and (vii) are the same as the step (iii) and the step (iv), respectively, in the scheme for obtaining the onium salt represented by the above-mentioned genreal formula (2). That is, the step (vi) is a step of converting the carboxylic acid (16) to a sodium salt (17), and the step (vii) is a step of obtaining an objective onium salt (1') by an ion-exchange reaction of the sodium salt (17) and an onium salt (15).

Among the above-mentioned schemes, the onium salt (15) to be used in the ion-exchange reaction with the carboxylic acid salts (14, 16) is not particularly limited, and may be exemplified by a sulfonium salt, an iodonium salt, an ammonium salt, etc., which can give the above-mentioned sulfonium cation, iodonium cation or ammonium cation.

When the onium salt represented by the above-mentioned general formula (0-1) of the present invention, in particular, the onium salt represented by the above-mentioned general formula (1) or (2) is formulated in the chemically amplified resist composition, a strong acid (sulfonic acid, etc.) generated from the other photoacid generator by exposure is exchanged with the onium salt of the present invention, to form a weak acid and a strong acid=onium salt whereby exchanging from a strong acid (sulfonic acid, etc.) having high acidity to a weak acid (carboxylic acid). It is to suppress the acid decomposition reaction of the acid-labile group as a result, and to make the acid diffusion distance small (to control), whereby it apparently acts as an acid diffusion controlling agent. The onium salt of the present invention contains a fluorine atom(s) at the α-position of the carboxyl group or a fluoroalkyl group so that acidity thereof is considered to be increased as compared with the carboxylic acid the α-position of which is not substituted. As a result, the difference of a pKa thereof from that of the strong acid such as sulfonic acid, etc., becomes small, so that a rapid exchange reaction is considered to be easily caused, and this is considered to be contributed to lower the roughness such as LER.

Acidity of the acid generated from the onium salt preferably has a pKa in the range of 1.5 to 4.0, more preferably in the range of 1.5 to 3.5. If the pKa is 1.5 or more, there is no fear of increasing the acidity than required, and it can function sufficiently as the acid diffusion controlling agent. On the other hand, if the pKa is 4.0 or less, the difference in the pKa thereof from that of the acid generated from the photoacid generator is not so large, and it does not completely trap the acid, so that the above-mentioned sufficient effect of reducing roughness by the exchange reaction of the acid and the onium salt can be obtained.

Also, the onium salt represented by the above-mentioned general formula (1) or (2) of the present invention contains a bulky alicyclic structure, so that it can be considered that migration and diffusion of the strong acid can be more effectively controlled. Incidentally, the onium salt represented by the above-mentioned general formula (1) or (2) of the present invention has sufficient lipophilicity so that producing and handling thereof are easy.

When it is such an onium salt, it can be suitably used as a material of the chemically amplified negative resist composition mentioned later.

The chemically amplified negative resist composition of the present invention is a composition containing the onium salt represented by the above-mentioned general formula (0-1), (1), or (2). The chemically amplified negative resist composition of the present invention is a composition containing, in addition to the above-mentioned onium salt, a base resin and an acid generator, and further preferably a composition containing a crosslinking agent, a basic compound and an organic solvent. When the chemically amplified negative resist composition of the present invention is to be prepared, a resin which becomes alkali insoluble by an action of an acid is used as the base resin. The resin which becomes alkali insoluble by an action of an acid is not particularly limited, and preferably used is a resin which becomes a higher molecular weight in which the resins form cross-linked structure by the action of an acid, or a resin which becomes a higher molecular weight by reacting with a crosslinking agent mentioned later by the action of an acid.

The above-mentioned base resin is preferably a resin containing a repeating unit represented by the following general formula (3) or a repeating unit represented by the following general formula (4), or both of them,

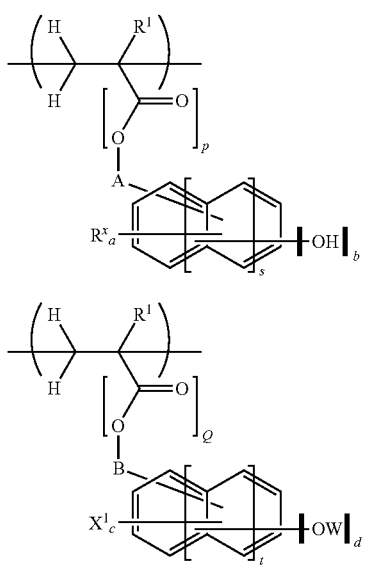

(3)

(4)

wherein each A and B represent a single bond or an alkylene group having 1 to 10 carbon atoms which may contain an ether bond(s) in the chain of the alkylene group; each $R^1$ independently represents a hydrogen atom or a methyl group; each $R^X$ independently represents a hydrogen atom or an alkyl group having 1 to 6 carbon atoms; X' represents a hydrogen atom, a linear, branched or cyclic alkyl group having 1 to 20 carbon atoms, an alkoxyalkyl group having 2 to 20 carbon atoms, an alkylthioalkyl group having 2 to 20 carbon atoms, a halogen atom, a nitro group, a cyano group, a sulfinyl group or a sulfonyl group; W represents an alkyl group having 1 to 20 carbon atoms or an acyl group having 1 to 20 carbon atoms; "a" and "c" represent integers of 0 to 4; "b" represents an integer of 1 to 5; "d" represents an integer of 0 to 5; each P and Q represent 0 or 1; and each "s" and "t" represent an integer of 0 to 2.

The repeating unit represented by the above-mentioned general formula (3) is a repeating unit which provides etching resistance as well as adhesion to the substrate and solubility to the alkaline developer. This repeating unit has already been used in many resist compositions for KrF excimer laser or resist compositions for an electron beam including the above-mentioned prior art technologies.

In the above-mentioned general formula (3), A represents a single bond or an alkylene group having 1 to 10 carbon atoms which may contain an ether bond(s) in the chain of the alkylene group.

Examples of the preferred alkylene group may be mentioned a methylene group, an ethylene group, a propylene group, a butylene group, a pentylene group, a hexylene group and structural isomers with carbon skeleton having a branched or cyclic structure, etc., and when it contains an ether bond, when P in the general formula (3) is 1, it may be at any position except for the position between the carbon at the α-position to the ester oxygen and the carbon at the β-position to the same. Also, when P is 0, the atom bonded to the main chain is an ether oxygen, and the second ether bond may be at any position except for the position between the carbon at the α-position to the ether oxygen and the carbon at the β-position to the same. If the carbon number of the above-mentioned alkylene group is 10 or less, it is preferred since solubility to the alkaline developer can be obtained sufficiently.

Each $R^X$ independently represents a hydrogen atom or an alkyl group having 1 to 6 carbon atoms; and preferred examples of the alkyl group having 1 to 6 carbon atoms may be mentioned a methyl group, an ethyl group, a propyl group, an isopropyl group, a butyl group, a pentyl group, a hexyl group and structural isomers with carbon skeleton having a branched or cyclic structure. If the carbon number is 6 or less, it is preferred since solubility to the alkaline developer can be sufficiently obtained.

In the above-mentioned general formula (3), "a" represents an integer of 0 to 4 and "b" represents an integer of 1 to 5, and when "s" represents 0, preferably "a" represents an integer of 0 to 3 and "b" represents an integer of 1 to 3, when "s" represents 1 or 2, preferably "a" represents an integer of 0 to 4 and "b" represents an integer of 1 to 5.

Further, "s" represents an integer of 0 to 2, and when "s" represents 0, it shows a benzene skeleton, when "s" represents 1, it shows a naphthalene skeleton, and when "s" represents 2, it shows an anthracene skeleton, respectively.

Among the repeating units represented by the above-mentioned general formula (3), when P represents 0 and A is a single bond, that is, the aromatic ring is directly bonded to the main chain of the polymer, i.e., there is no linker, the repeating unit is a unit derived from a monomer having a substituted or unsubstituted vinyl group at its 1-position that is bonded to an aromatic ring substituted with a hydroxyl group, which is represented by a hydroxystyrene unit, and preferred specific examples thereof may be mentioned 3-hydroxystyrene, 4-hydroxystyrene, 5-hydroxy-2-vinylnaphthalene, 6-hydroxy-2-vinylnaphthalene, etc.

Also, the repeating unit when P is 1, that is, when it has an ester skeleton as the linker, is a vinyl monomer unit substituted with a carbonyl group, which is represented by a (meth) acrylate ester.

Preferred specific examples of the general formula (3) in the case of having a linker (—CO—O-A-) derived from a (meth)acrylate ester are shown below.

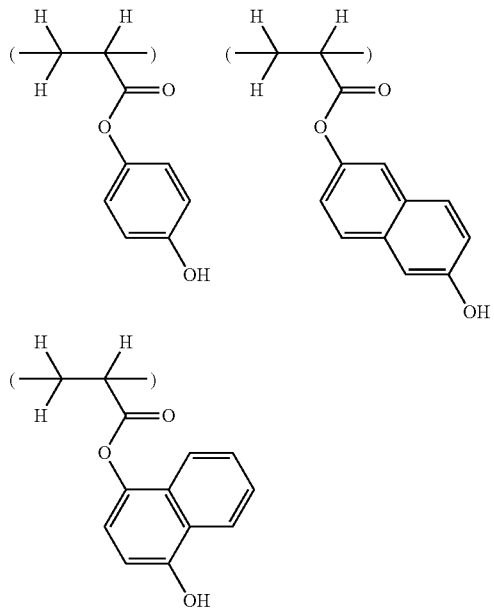

-continued
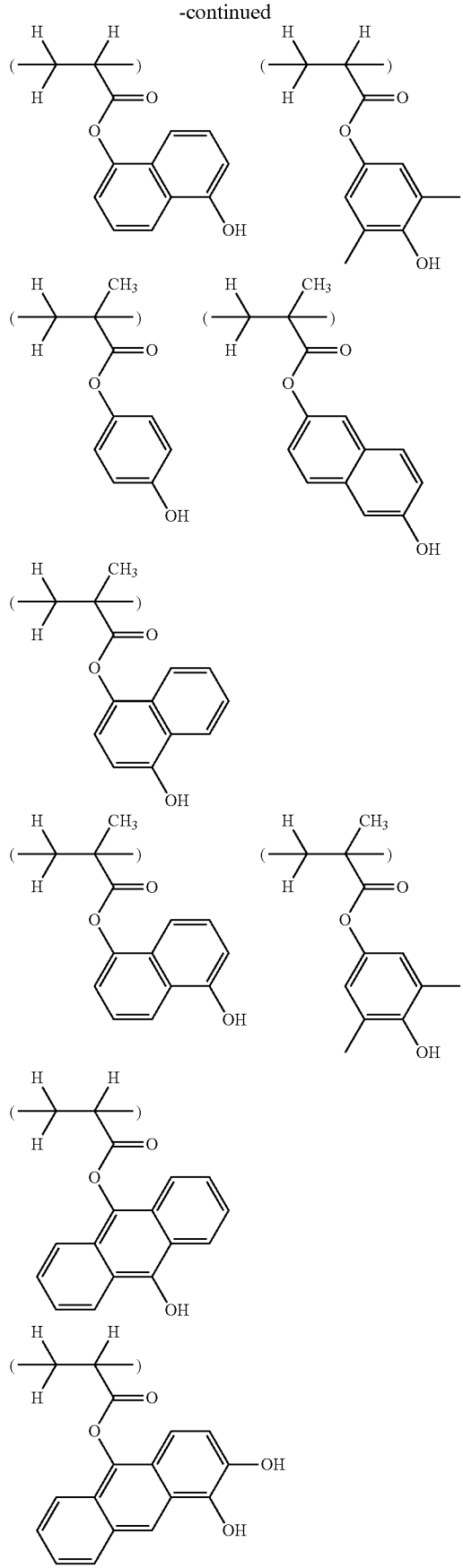
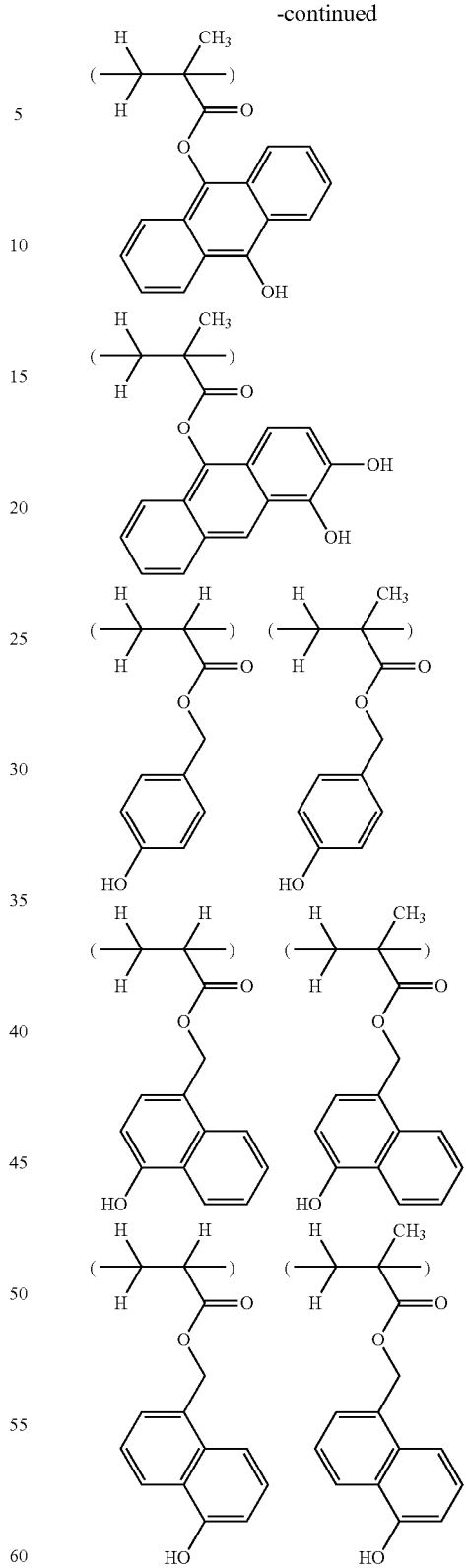
The repeating unit represented by the above-mentioned general formula (4) is a repeating unit which provides etching resistance as well as controls solubility to the alkaline developer. This repeating unit has also already been used as in the above-mentioned general formula (3) in many resist compositions for KrF excimer laser or resist compositions for an electron beam including the above-mentioned prior art technologies.

In the above-mentioned general formula (4), B is a single bond or an alkylene group having 1 to 10 carbon atoms which may contain an ether bond(s) in the chain of the alkylene group.

Preferred examples of the alkylene group may be mentioned a methylene group, an ethylene group, a propylene group, a butylene group, a pentylene group, a hexylene group and structural isomers of the carbon skeleton having a branched or a cyclic structure, etc., and when an ether bond is contained therein, and when Q in the general formula (4) is 1, it may be at any position except for the position between the carbon at the α-position to the ester oxygen and the carbon at the β-position to the same. Also, when Q represents 0, the atom bonded to the main chain is an ether oxygen, and the second ether bond may be at any position except for the position between the carbon at the α-position to the ether oxygen and the carbon at the β-position to the same. Incidentally, if the carbon number of the above-mentioned alkylene group is 10 or less, it is preferred since solubility to the alkaline developer can be sufficiently obtained.

X' shown in the above-mentioned general formula (4) represents a hydrogen atom, a linear, branched or cyclic alkyl group having 1 to 20 carbon atoms, an alkoxyalkyl group having 2 to 20, preferably 2 to 10 carbon atoms, an alkylthioalkyl group having 2 to 20, preferably 2 to 10 carbon atoms, a halogen atom, a nitro group, a cyano group, a sulfinyl group or a sulfonyl group. More specific preferred substituents may be mentioned a hydrogen atom, a halogen atom such as a chlorine atom, a bromine atom and an iodine atom, an alkyl group such as a methyl group, an ethyl group, a propyl group, a butyl group, a pentyl group, a hexyl group and structural isomers thereof, a cyclopentyl group, a cyclohexyl group, etc. If the carbon number thereof is 20 or less, an effect of controlling and adjusting solubility of the base resin to an alkaline developer (mainly a lowering effect) can be made suitable, and generation of scum (development defects) can be suppressed. Also, among the preferred substituents as mentioned above, particularly, as a substituent which can be prepared as a monomer easily and can be used usefully, there may be mentioned a hydrogen atom, a chlorine atom, a bromine atom, an iodine atom, a methyl group and an ethyl group.

Also, W shown in the above-mentioned general formula (4) represents an alkyl group having 1 to 20 carbon atoms, preferably 1 to 6 carbon atoms or an acyl group having 1 to 20 carbon atoms, preferably 2 to 7 carbon atoms, and when W is an alkyl group, OW is an alkoxy group, and W is an acyl group, OW is an acyloxy group. Preferred alkoxy group may be mentioned a methoxy group, an ethoxy group, a propoxy group, a butoxy group, a pentyloxy group, a hexyloxy group and structural isomers at the hydrocarbon moiety thereof, a cyclopentyloxy group, a cyclohexyloxy group, etc., and a methoxy group and an ethoxy group can be particularly utilized usefully. Also, the acyloxy group can be easily introduced therein by the chemical modification method even after polymerization of the polymer, and it can be advantageously used for fine adjustment of solubility of the base resin to the alkaline developer. In this case, a methylcarbonyloxy group, an ethylcarbonyloxy group, a propylcarbonyloxy group, a butylcarbonyloxy group, a pentylcarbonyloxy group, a hexylcarbonyloxy group and structural isomers thereof, a cyclopentylcarbonyloxy group, a cyclohexylcarbonyloxy group, a benzoyloxy group, etc., can be preferably used.

In the above-mentioned general formula (4), "c" represents an integer of 0 to 4 and "d" represents an integer of 0 to 5, when "t" represents 0, preferably "c" represents an integer of 0 to 3 and "d" represents an integer of 0 to 3, and when "t" represents 1 or 2, preferably "c" represents an integer of 0 to 4 and "d" represents an integer of 0 to 5.

Further, "t" represents an integer of 0 to 2, when "t" represents 0, it shows a benzene skeleton, when "t" represents 1, it shows a naphthalene skeleton, and when "t" represents 2, it shows an anthracene skeleton, respectively.

Among the basic skeleton of the repeating units represented by the above-mentioned general formula (4), when Q represents 0 and B is a single bond, that is, the aromatic ring is directly bonded to the main chain of the polymer, i.e., there is no linker, the basic skeleton of the repeating unit is a unit derived from a monomer substituted with the above-mentioned X' and/or OW, having a substituted or unsubstituted vinyl group at its 1-position that is bonded to the aromatic ring, which is represented by the styrene skeleton, and preferred specific examples of the basic skeletons may be mentioned styrene, 4-chlorostyrene, 4-methyistyrene, 4-methoxystyrene, 4-bromostyrene, 2-hydroxypropylstyrene, 2-vinylnaphthalene, 3-vinylnaphthalene, etc.

Also, the repeating unit when Q represents 1, that is, it has an ester skeleton as the linker, is a vinyl monomer unit substituted with a carbonyl group, which is represented by a (meth)acrylate ester.

Preferred specific examples regarding the basic skeleton of the general formula (4) in the case of having a linker (—CO—O—B—) derived from a (meth)acrylate ester are shown below.

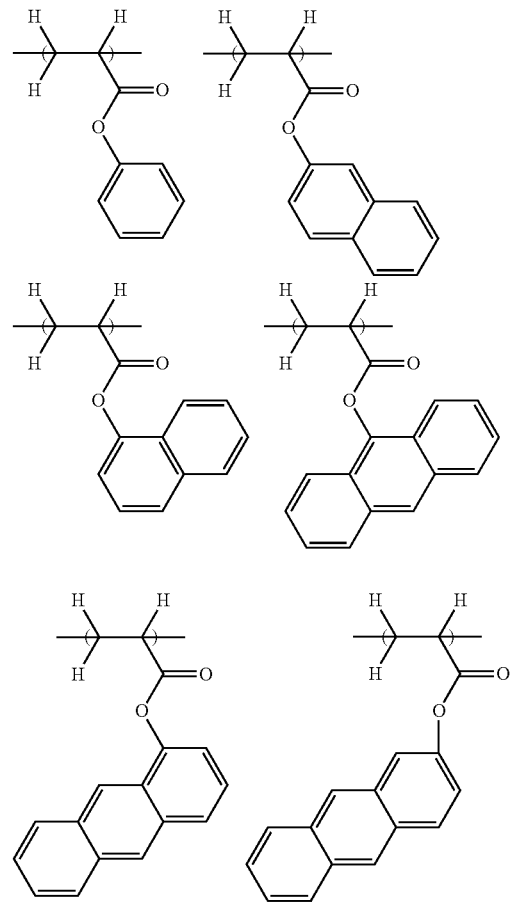

21
-continued
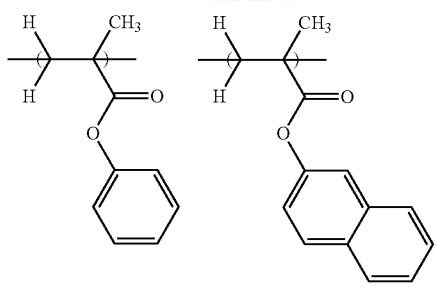
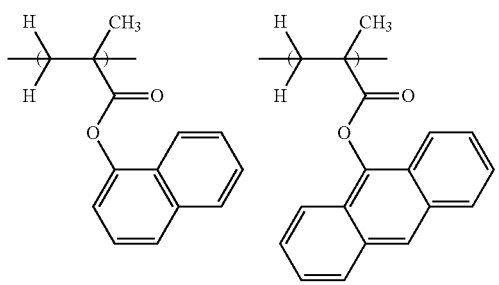
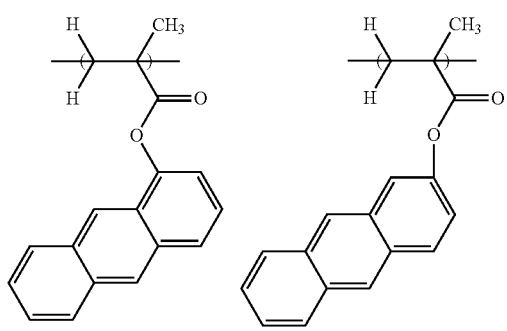
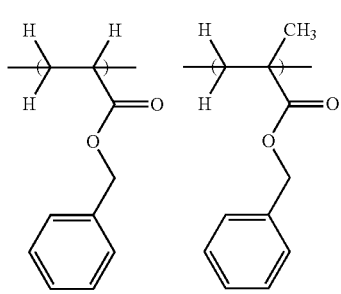
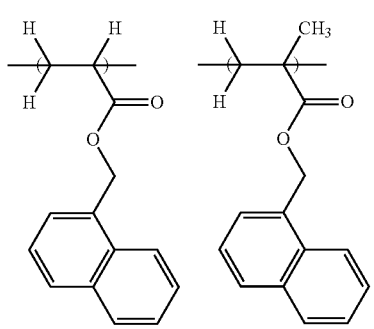
22
-continued
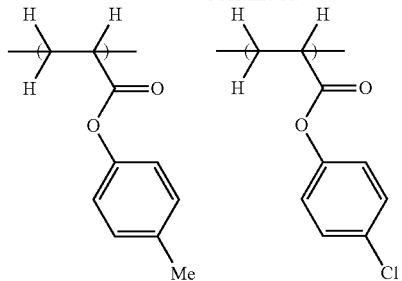
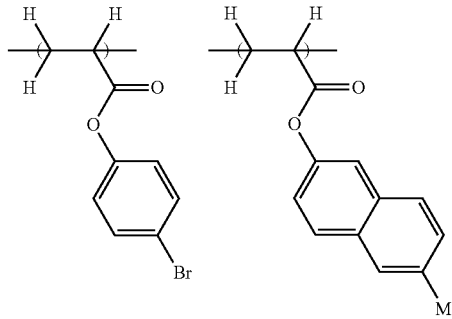
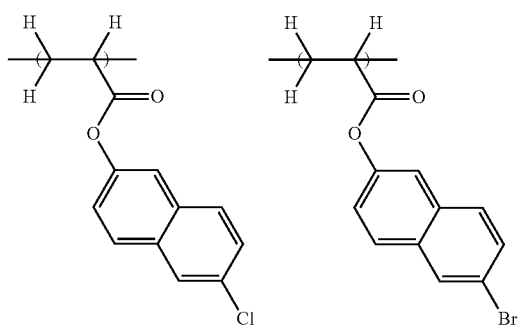
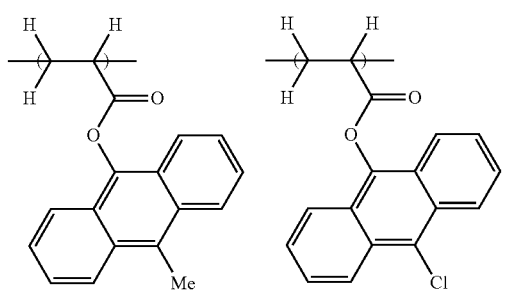
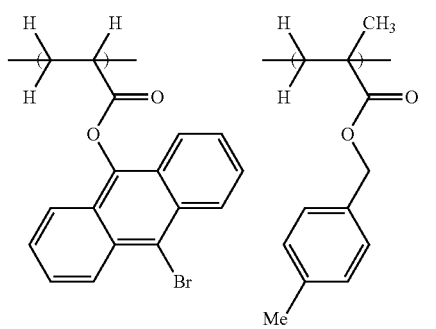

-continued

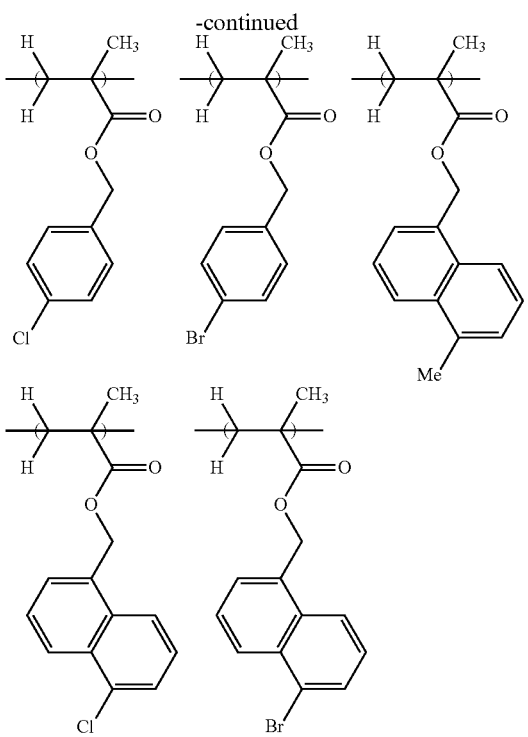

wherein Me represents a methyl group.

It is also preferred that the above-mentioned base resin further contains a repeating unit represented by the following general formula (5) or a repeating unit represented by the following general formula (6), or both of them, as the main constitutional unit of the polymer,

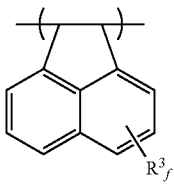

(5)

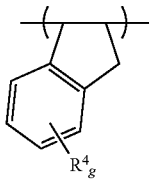

(6)

wherein "f" represents an integer of 0 to 6; each $R^3$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s); "g" represents an integer of 0 to 4; each $R^4$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s).

When these repeating units (at least one of the repeating unit represented by the above-mentioned general formula (5) and the repeating unit represented by the above-mentioned general formula (6)) are used as a constitutional component(s), it is possible to obtain an effect of heightening resistance to electron beam irradiation at the time of etching or pattern inspection due to addition of the cyclic structure to the main chain, in addition to etching resistance due to the aromatic ring.

The units which improve etching resistance by providing a cyclic structure to the main chain represented by the above-mentioned general formula (5) and the general formula (6) may be used one kind alone or a plural kinds of the units in combination, and to obtain the effect that etching resistance is to be improved, it is preferably introduced in an amount of 5 mole % or more based on the amount of the whole monomer unit constituting the base resin.

The above-mentioned base resin to be used in the chemically amplified negative resist composition of the present invention preferably comprises the above-mentioned general formulae (3) and (4) as the main constitutional units, and further the units of the general formulae (5) and (6) which can be introduced, in an amount of 60 mole % or more based on the amount of the whole monomer unit constituting the base resin whereby the characteristics required as the chemically amplified negative resist composition of the present invention can be certainly obtained, more preferably 70 mole % or more, particularly preferably 85 mole % or more.

When the base resin comprises the repeating units(s) selected from the units represented by the general formulae (3) to (6) as the whole constitutional unit, both high etching resistance and excellent resolution can be attained. As the repeating units other than the units represented by the general formulae (3) to (6), there may be used a (meth)acrylate ester unit protected by the conventionally used acid-labile group, or a (meth)acrylate ester unit having an adhesion group such as a lactone structure, etc. Fine adjustment of the characteristics of the resist film may be carried out by these other repeating unit(s), but these unit(s) may not be contained.

The base resin to be used in the resist composition of the present invention can be obtained by copolymerizing the respective monomers by combining protection and deprotection reaction, depending on necessity, according to the conventionally known method. The copolymerization reaction is not particularly limited, and preferably radical polymerization, or anion polymerization. These methods can be referred to International Patent Laid-Open Publication No. 2006/121096, Japanese Patent Laid-Open Publication No. 2008-102383, Japanese Patent Laid-Open Publication No. 2008-304590 and Japanese Patent Laid-Open Publication No. 2004-115630.

A preferred molecular weight of the above-mentioned base resin to be used in the above-mentioned chemically amplified negative resist composition is preferably a weight average molecular weight of 2,000 to 50,000, more preferably 3,000 to 20,000 when the molecular weight is measured, as a general method, by gel permeation chromatography (GPC) using polystyrenes as standard samples. If the weight average molecular weight is 2,000 or more, there is no fear of causing the phenomenon that the profile of the pattern becomes rounding to lower the resolution, as well as the line edge roughness is deteriorated as has conventionally been known. On the other hand, if the molecular weight becomes larger than required, line edge roughness tends to be increased while it depends on the pattern to be resolved, so that the molecular weight is preferably controlled to 50,000 or less, in particular, when a pattern with a pattern line width of 100 nm or less is to be formed, it is preferably controlled to 20,000 or less.

Incidentally, measurement of the GPC can be carried out by using tetrahydrofuran (THF) solvent generally used.

Further, in the base resin to be used in the above-mentioned chemically amplified negative resist composition of the present invention, the molecular weight distribution (Mw/Mn) is preferably narrow distribution of 1.0 to 2.0, particularly preferably 1.0 to 1.8. When it is narrow distribution as mentioned above, no foreign substance is generated on the pattern or the profile of the pattern is not deteriorated after development.

In the chemically amplified negative resist composition of the present invention, an acid generator is contained for making the negative resist composition to be used in the patterning process of the present invention function. As such an acid generator, for example, a compound (a photoacid generator) which generates an acid in response to active beam or irradiation beam may be contained. As the component of the photoacid generator, any compound may be used as long as it is a compound generating an acid by irradiation of a high-energy beam. Suitable photoacid generator may be mentioned a sulfonium salt, an iodonium salt, sulfonyldiazomethane, N-sulfonyloxyimide, an oxime-O-sulfonate type acid generator, etc. These may be used singly or two or more kinds in admixture.

Specific examples of such an acid generator are disclosed in the paragraphs [0122] to [0142] of Japanese Patent Laid-Open Publication No. 2008-111103.

Among the specific examples of the above-mentioned acid generator, an arylsulfonate type photoacid generator is preferred to generate an acid with suitable acid strength for reacting the crosslinking agent and the polymer mentioned later. Also, for obtaining an effect to improve LER by causing an exchange reaction by combining a generating acid and the onium salt contained in the resist composition of the present invention, a pKa of the acid generating from the photoacid generator is preferably in the range of −3.0 to 1.5, more preferably in the range of −1.0 to 1.5.

Into the chemically amplified negative resist composition of the present invention, a crosslinking agent may be further formulated to form or strengthen the cross-linked structure of the base resin. Specific examples of the crosslinking agent which may be used in the present invention may be enumerated by a melamine compound that is substituted by at least one group selected from a methylol group, an alkoxymethyl group and an acyloxymethyl group; a guanamine compound, a glycoluril compound, a urea compound, an epoxy compound, an isocyanate compound, an azide compound and a compound containing a double bond such as an alkenyl ether group, etc. These may be used as an additive, or may be introduced into the polymer side chain as a pendant group. Also, a compound containing a hydroxyl group may be also used as the crosslinking agent.

Among the specific examples of the above-mentioned crosslinking agents, when the epoxy compound is further exemplified, there may be exemplified by tris(2,3-epoxypropyl)isocyanurate, trimethylolmethane triglycidyl ether, trimethylolpropane triglycidyl ether, triethylolethane triglycidyl ether, etc.

When the melamine compound is specifically exemplified, there may be mentioned hexamethylolmelamine, hexamethoxymethylmelamine, a compound in which 1 to 6 methylol groups of the hexamethylolmelamine is/are methoxymethylated or a mixture thereof, hexamethoxyethylmelamine, hexaacyloxymethylmelamine, and a compound in which 1 to 6 methylol groups of the hexamethylolmelamine is/are acyloxymethylated or a mixture thereof.

The guanamine compound may be mentioned tetramethylol guanamine, tetramethoxymethyl guanamine, a compound in which 1 to 4 methylol groups of the tetramethylol guanamine is/are methoxymethylated or a mixture thereof, tetramethoxyethyl guanamine, tetraacyloxy guanamine, and a compound in which 1 to 4 methylol groups of the tetramethylol guanamine is/are acyloxymethylated or a mixture thereof.

The glycoluril compound may be mentioned tetramethylol glycoluril, tetramethoxy glycoluril, tetramethoxy methyl glycoluril, a compound in which 1 to 4 methylol groups of the tetramethylol glycoluril is/are methoxymethylated or a mixture thereof, and a compound in which 1 to 4 methylol groups of the tetramethylol glycoluril is/are acyloxymethylated or a mixture thereof.

The urea compound may be mentioned tetramethylol urea, tetramethoxymethyl urea, a compound in which 1 to 4 methylol group of the tetramethylol urea is/are methoxymethylated or a mixture thereof, and tetramethoxyethyl urea, etc.

The isocyanate compound may be mentioned tolylene diisocyanate, diphenylmethane diisocyanate, hexamethylene diisocyanate and cyclohexane diisocyanate, etc.

The azide compound may be mentioned 1,1'-biphenyl-4,4'-bisazide, 4,4'-methylidene bisazide and 4,4'-oxybisazide.

The compound containing an alkenyl ether group may be mentioned ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropanetrivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, trimethylolpropanetrivinyl ether, etc.

A formulation amount of the crosslinking agent is preferably 0 to 50 parts by mass, more preferably 5 to 50 parts by mass, further preferably 10 to 30 parts by mass, based on 100 parts by mass of the base resin, and it may be used singly or two or more kinds in admixture. If the amount is 5 parts by mass or more, sufficient improvement in resolution can be obtained, while if it is 30 parts by mass or less, there is little possibility to lower the resolution by adhesion between the patterns.

In the resist composition of the present invention, an amine compound having a carboxyl group but not having a hydrogen atom covalently bonded to a nitrogen atom of a basic center may be contained as a basic compound.

In patterning, the problem of the so-called substrate dependency of the pattern, in which the profile is changed in the vicinity of the substrate depending on a material of the workpiece, and a small change in the profile becomes the problem accompanied by miniaturization of the objective pattern. In particular, when a photomask blank is to be processed, if patterning is carried out using the chemically amplified negative resist composition on chromium oxynitride which is a material at the outermost surface of the photomask blank, there was a case that a cleavage had been formed at the contacting part of the pattern with the substrate, which is the so-called undercut. However, generation of the above-mentioned undercut can be prevented by formulating an amine compound having a carboxyl group but not having a hydrogen atom covalently bonded to a nitrogen atom of a basic center.

In the point of preventing from generation of the above-mentioned undercut, a tertiary amine not having a hydrogen atom covalently bonded to a nitrogen atom of a basic center is preferred than the amine compound having a hydrogen atom covalently bonded to a nitrogen atom of a basic center such as a primary amine having a carboxyl group since the former shows the effect to its maximum.

Also, among the above-mentioned tertiary amines, if it is a compound showing stronger basicity than the amine compound of a weak base in which a nitrogen contained in the aromatic ring is a basic center such as 2-quinolinecarboxylic acid and nicotinic acid, the carboxyl groups are well arranged at the substrate side, and inactivation of the generated acid derived from the acid generator, etc., by diffusing to the substrate can be more effectively prevented.

The problem of the undercut is likely caused in the case of the substrate where the material at the surface comprises a nitrided compound such as TiN, SiN, SiON, etc., in particular, it is extremely easily caused in either of the case where the surface is a metal chromic compound, or where it is metal chromium or a chromium compound containing nitrogen and/or oxygen, and it is difficult to solve the problem. However, when the resist composition of the present invention containing the above-mentioned basic compound is used, a pattern having good profile can be formed even onto the substrate the outermost surface of which is a chromic compound, and the composition can be advantageously used in the processing of a photomask blank, etc.

Specific examples of the chemical structures of the above-mentioned amine compound having a carboxyl group but not having a hydrogen atom covalently bonded to a nitrogen atom of a basic center may be preferably mentioned a basic compound including the amine compound and the amineoxide compound represented by the following general formulae (7) to (9), but the invention is not limited by these,

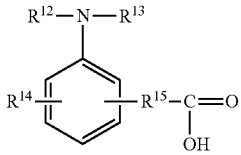
(7)

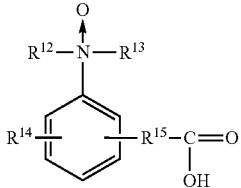
(8)

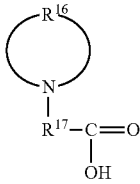
(9)

wherein each $R^{12}$ and $R^{13}$ represent a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, or $R^{12}$ and $R^{13}$ may be bonded to form a cyclic structure with the nitrogen atom to which they are bonded; $R^{14}$ represents a hydrogen atom, a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, branched or cyclic alkylene group having 1 to 20 carbon atoms, or an arylene group having 6 to 20 carbon atoms; $R^{16}$ represents a linear or branched alkylene group having 2 to 20 carbon atoms which may be substituted, and the alkylene group may contain one or a plural number of a carbonyl group(s) (—CO—), an ether group(s) (—O—), an ester group(s) (—COO—), a sulfide bond(s) (—S—) between carbon-carbon bond of the alkylene group; and $R^{17}$ represents a linear, branched or cyclic alkylene group having 1 to 20 carbon atoms, or an arylene group having 6 to 20 carbon atoms.

In the above-mentioned general formulae (7) to (9), the linear, branched or cyclic alkyl group having 1 to 20 carbon atoms may be specifically exemplified by a methyl group, an ethyl group, a propyl group, an isopropyl group, a butyl group, an isobutyl group, a t-butyl group, a pentyl group, a hexyl group, a decyl group, a cyclopentyl group, a cyclohexyl group and a decahydronaphthalenyl group, the aryl group having 6 to 20 carbon atoms may be specifically exemplified by a phenyl group, a naphthyl group, an anthryl group, a phenanthryl group, a pyrenyl group, a naphthacenyl group and a fluorenyl group, the aralkyl group having 7 to 20 carbon atoms may be specifically exemplified by a benzyl group, a phenethyl group, a phenylpropyl group, a naphthylmethyl group, a naphthylethyl group and an anthracenylmethyl group, the hydroxyalkyl group having 2 to 20 carbon atoms, preferably 2 to 10 carbon atoms may be specifically exemplified by a hydroxymethyl group, a hydroxyethyl group and a hydroxypropyl group, the alkoxyalkyl group having 2 to 20 carbon atoms, preferably 2 to 10 carbon atoms may be specifically exemplified by a methoxymethyl group, an ethoxymethyl group, a propoxymethyl group, an isopropoxymethyl group, a butoxymethyl group, an isobutoxymethyl group, a t-butoxymethyl group, a t-amyloxymethyl group, a cyclohexyloxymethyl group and a cyclopentyloxymethyl group, the acyloxyalkyl group having 2 to 20 carbon atoms, preferably 2 to 10 carbon atoms may be specifically exemplified by a formyloxymethyl group, an acetoxymethyl group, a propionyloxymethyl group, a butyryloxymethyl group, a pivaloyloxymethyl group, a cyclohexanecarbonyloxymethyl group and a decanoyloxymethyl group, the alkylthioalkyl group having 2 to 20 carbon atoms, preferably 2 to 10 carbon atoms may be specifically exemplified by a methylthiomethyl group, an ethylthiomethyl group, a propylthiomethyl group, an isopropylthiomethyl group, a butylthiomethyl group, an isobutylthiomethyl group, a t-butylthiomethyl group, a t-amylthiomethyl group, a decylthiomethyl group and a cyclohexylthiomethyl group, respectively, but the invention is not limited by these.

Preferred specific examples of the amine compound represented by the general formula (7) are exemplified in the following, but the invention is not limited by these.

o-dimethylaminobenzoic acid, p-dimethylaminobenzoic acid, m-dimethylaminobenzoic acid, p-diethylaminobenzoic acid, p-dipropylaminobenzoic acid, p-diisopropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalene acid, 3-diethylamino-2- naphthalene acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylamino-phenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylamino-phenyllactic acid, 2-(4-dimethylaminophenyl)benzoic acid, 2-(4-(dibutylamino)-2-hydroxybenzoyl)benzoic acid.

Preferred specific examples of the amineoxide compound represented by the general formula (8) may be mentioned those in which the amine compounds specifically exemplified by the above-mentioned general formula (7) are oxidized, but the invention is not limited by these.

Preferred specific examples of the amine compound represented by the general formula (9) are exemplified in the following, but the invention is not limited by these.

1-piperidinepropionic acid, 1-piperidinebutyric acid, 1-piperidinemalic acid, 1-piperidinepyruvic acid, 1-piperidinelactic acid The chemically amplified negative resist composition of the present invention may contain the above-mentioned basic compound of the amine compound, the amineoxide compound, etc., as one kind or two or more kinds in combination.

To the chemically amplified negative resist composition of the present invention may be added an organic solvent for improving coating property to the workpiece, etc. Specific examples of the organic solvent may be exemplified by those disclosed at the paragraph[0144] of Japanese Patent Laid-Open Publication No. 2008-111103.

A formulation amount of the organic solvent is preferably 200 to 3,000 parts by mass based on 100 parts by mass of the base resin, and particularly 400 to 2,500 parts by mass are suitable.

To the chemically amplified negative resist composition of the present invention may be added a surfactant commonly used for improving coating property. When the surfactant is used, a lot of surfactants have been conventionally known as many examples are disclosed in International Patent Laid-Open Publication No. 2006/121096, Japanese Patent Laid-Open Publication No. 2008-102383, Japanese Patent Laid-Open Publication No. 2008-304590, Japanese Patent Laid-Open Publication No. 2004-115630 and Japanese Patent Laid-Open Publication No. 2005-8766, and a suitable surfactant can be selected by referring to these.

An amount of the surfactant to be added is preferably 2 parts by mass or less, more preferably 1 part by mass or less and 0.01 part by mass or more based on 100 parts by mass of the base polymer in the chemically amplified resist composition.

Also, the chemically amplified negative resist composition of the present invention may further contain other kinds of onium salt(s) in addition to the above-mentioned onium salt.

When such a chemically amplified negative resist composition is employed, acid diffusion at the time of exposure can be effectively controlled by the action of the onium salt contained therein, undercut of the pattern can be effectively suppressed by containing the basic compound and it has adhesion to the workpiece and good etching selectivity to the workpiece so that a pattern which is fine and having high resolution, and reduced in LER can be obtained.

[Patterning Process]

The present invention further provides a patterning process which comprises the steps of forming a resist film on a workpiece using the above-mentioned chemically amplified negative resist composition, irradiating a high energy beam to the resist film, and developing the resist film after irradiation using an alkaline developer to obtain a resist pattern.

In the patterning process of the present invention, a pattern can be formed by employing the conventionally known lithography technology. Generally, the above-mentioned chemically amplified negative resist composition is coated on a workpiece exemplified by a substrate (Si, $SiO_2$, SiN, SiON, TiN, WSi, BPSG, SOG, an organic anti-reflecting film, etc.) for manufacturing an integrated circuit or a substrate (Cr, CrO, CrON, MoSi, etc.) for manufacturing a mask circuit, etc., by the means of spin coating, etc., so as to make a film thickness of 0.03 to 2.0 µm, and the film is prebaked on a hot plate at 60 to 150° C. for 1 to 20 minutes, preferably at 80 to 140° C. for 1 to 10 minutes to form a resist film.

Then, by using a mask for forming an objective pattern, or directly by beam exposure, a high-energy beam such as ultraviolet beam, far ultraviolet beam, an electron beam, EUV, X ray, γ beam, synchrotron radiation ray, etc., is pattern irradiated with an exposure dose of, for example, 1 to 200 $mJ/cm^2$, preferably 10 to 100 $mJ/cm^2$. Incidentally, the chemically amplified negative resist composition of the present invention is particularly effective in the case of pattern irradiation using EUV or an electron beam. Exposure may be carried out by the usual exposure method as well as, in some cases, the immersion method in which immersion is carried out between the mask and the resist. In such a case, it is possible to use a top coat insoluble in water.

Next, the film is subjected to post-exposure bake (PEB) on a hot plate at 60 to 150° C. for 1 to 20 minutes, preferably at 80 to 140° C. for 1 to 10 minutes. Further, by using a developer of an aqueous alkali solution containing 0.1 to 5% by mass, preferably 2 to 3% by mass of tetramethylammonium hydroxide (TMAH), etc., development is carried out by the conventional method such as a dipping method, a puddle method, a spray method, etc., for example, for 0.1 to 3 minutes, preferably for 0.5 to 2 minutes, to dissolve the unexposed area not forming cross-linked structure in the resist film and form an objective (negative) pattern on the substrate.

Incidentally, the resist composition of the present invention has particularly high etching resistance so that it can endure severe etching conditions, and it is useful when it is used under the conditions that require little line edge roughness. Also, it is particularly useful, as a substrate to be processed, for a substrate having a material which likely causes pattern peeling-off or pattern fall on the surface thereof by the reason that adhesion of the resist pattern is poor, and is useful for forming a pattern on a substrate on which a film is formed by sputtering metal chromium or a chromium compound containing one or more light elements such as oxygen, nitrogen and carbon at the outermost surface as a layer, in particular, on a photomask blank.

Such a patterning process is employed, by using the above-mentioned chemically amplified negative resist composition for forming a resist film, acid diffusion at the time of exposure can be effectively controlled, and even when a substrate (in particular, a photomask blank) having a layer containing chromium at the outermost surface is used as a workpiece, an effect of a generating acid such as undercut, etc., can be suppressed, so that a pattern having high resolution and reduced in LER can be formed. In addition, adhesion between the resist film and the workpiece as well as etching selectivity are good, and occurrence of pattern fall or poor pattern transferring, etc. can be suppressed when a fine pattern is formed thinning of the resist film, so that it can be suitably used for microprocessing technology, in particular, for an electron beam and EUV lithography technology.

EXAMPLES

In the following, the present invention is specifically explained by referring to Synthesis Examples, Examples and Comparative Example, but the present invention is not limited by the following Examples. Incidentally, in the following examples, Me represents a methyl group. Also, the copolymerization composition ratio is a molar ratio, and the weight average molecular weight (Mw) shows a weight average molecular weight in terms of a polystyrene by gel permeation chromatography (GPC).

Synthesis Example 1

Synthesis of Onium Salt

The onium salt contained in the chemically amplified negative resist composition of the present invention was synthesized by the scheme mentioned below. The structures of the synthesized onium salts (Q-1 to Q-4) to be used in the present invention and the structures of the onium salts (Comparative Q-1 to Q-4) to be used in Comparative Examples were shown in Table 5 mentioned later.

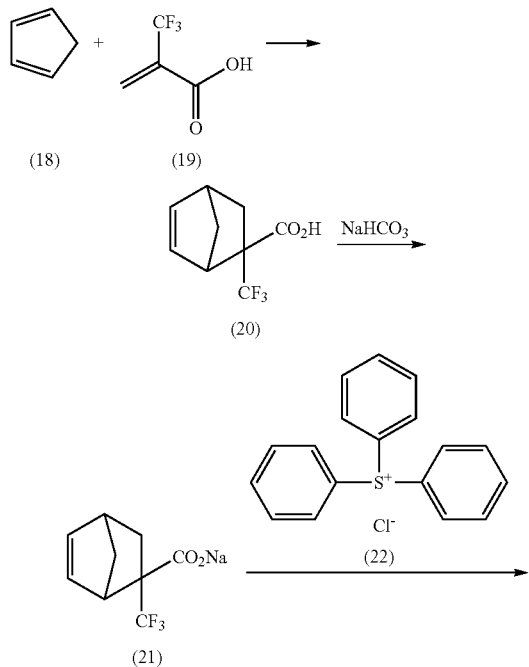

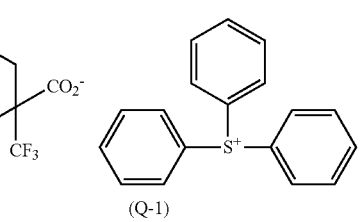
(Q-1)

Synthesis Example 1-1

Synthesis of Q-1

Synthesis Example 1-1-1

Synthesis of 2-trifluoromethylbicyclo[2,2,2,1]hepta-5-ene-2-carboxylic acid (20)

22.7 g of cyclopentadiene (18) and 40.0 g of trifluoromethylacrylic acid (19) were stirred at room temperature in 40 g of benzene overnight. 20 g of hexane was poured into the reaction mixture to precipitate white solid and the precipitate was collected by filtration to obtain 45.6 g (Yield: 77%) of the carboxylic acid (20).

Synthesis Example 1-1-2

Synthesis of sodium 2-trifluoromethylbicyclo[2,2,1]hepta-5-ene-2-carboxylate (21)

5.0 g of the carboxylic acid (20) obtained in (Synthesis Example 1-1-1) was dissolved in 10.0 g of methylene chloride, and 2.0 g of sodium hydrogen carbonate and 10 g of water were added to the solution and the resulting mixture was stirred overnight. Methylene chloride and water were distilled off under reduced pressure to obtain sodium carboxylate (21). This material was used in the next reaction without purification any more.

Synthesis Example 1-1-3

Synthesis of triphenylsulfonium 2-trifluoromethylbicyclo[2,2,1]hepta-5-ene-2-carboxylate (Q-1)

Sodium carboxylate (21) obtained in (Synthesis Example 1-1-2) was dissolved in 20 g of methylene chloride, 40 g of an aqueous solution of triphenylsulfonium chloride (22) was added to the solution and the resulting mixture was stirred for 30 minutes. The organic layer was separated, the aqueous layer was extracted with $CH_2Cl_2$, and the combined organic layers were washed three times with $H_2O$. The solvent was distilled off under reduced pressure to obtain 4.6 g of the objective material, onium salt (Q-1) (Yield: 40%).

Synthesis Example 1-2

Synthesis of Q-2

Synthesis was carried out in the same manner except for changing cyclopentadiene in the synthesis of Q-1 in Synthesis Example 1-1 to furan to obtain 3.8 g (three-step yield: 29%) of Q-2.

Synthesis Example 1-3

Synthesis of Q-3

2-Trifluoromethylbicyclo[2,2,1]hepta-5-ene-2-carboxylic acid (20) obtained in Synthesis Example 1-1-1 was stirred in a toluene solvent in the presence of 5% Pd/C catalyst at room temperature under hydrogen atmosphere to obtain 2-trifluoromethylbicyclo[2,2,1]heptane-2-carboxylic acid. In the same synthetic routes as in Synthesis Example 1-1-2 to 1-1-3 except for using the carboxylic acid as the starting material to obtain 3.9 g (four-step yield: 32%) of Q-3.

Synthesis Example 1-4

Synthesis of Q-4

In the same synthetic routes as in Synthesis Example 1-1-2 to 1-1-3 except for changing the carboxylic acid (20) in Synthesis Example (1-1-2) to the carboxylic acid represented by the following formula (23) to obtain 2.8 g (two-step yield: 33%) of Q-4.

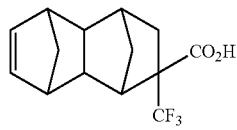

(23)

Synthesis Example 2

Synthesis of Base Resin

The base resins (polymers) used in the resist compositions of the present invention were synthesized by the following scheme. The composition ratios of the synthesized respective polymers were shown in Table 1, and the structures of the repeating units were shown in Table 2 to Table 4.

Polymer Synthesis Example 2-1

Synthesis of Polymer 1

To 3 L of a flask were added 238.0 g of acetoxystyrene, 22.6 g of 4-chlorostyrene and 189.4 g of indene, and 675 g of toluene as a solvent. The reaction apparatus was cooled to −70° C. under nitrogen atmosphere, and degassing under reduced pressure and nitrogen flow were repeated three times. After the temperature was raised to room temperature, 40.5 g of 2,2'-azobis(2,4-dimethylvaleronitrile) (V-65 available from Wako Pure Chemical Industries, Ltd.) was added to the mixture as a polymerization initiator, and after the temperature was raised to 45° C., the reaction was carried out for 20 hours, then, the temperature was raised to 55° C., the reaction was further carried out for 20 hours. The reaction solution was concentrated to a half volume, the concentrate was precipitated in 15.0 L of a methanol solution, and the obtained white solid was collected by filtration and dried at 40° C. under reduced pressure to obtain 311 g of a white polymer.

The polymer was dissolved again in 488 g of methanol and 540 g of tetrahydrofuran, and 162 g of triethylamine and 32 g of water were added to the solution to carry out the deprotection reaction at 60° C. for 40 hours. The reaction mixture was concentrated as a fractionating step, then, the concentrate was dissolved in a mixed solvent comprising 548 g of methanol and 112 g of acetone, and to the dissolved solution was added dropwise 990 g of hexane over 10 minutes. The mixed white turbid liquid was allowed to stand to separate the liquids, and the lower layer (polymer layer) was taken out and concentrated. The polymer concentrated again was further dissolved in a mixed solvent comprising 548 g of methanol and 112 g of acetone, the dissolved solution was subjected to dispersing and liquid separating operations using 990 g of hexane, and the obtained lower layer (polymer layer) was concentrated. The concentrated liquid was dissolved in 870 g of ethyl acetate, and the solution was subjected to neutralization, liquid separation and washing with a mixed solution comprising 250 g of water and 98 g of acetic acid once, and further with 225 g of water and 75 g of pyridine once, and liquid separation and washing with 225 g of water four times. Thereafter, the ethyl acetate solution of the upper layer was concentrated, the concentrate was dissolved in 250 g of acetone, precipitated in 15 L of water, and the precipitate was collected by filtration and vacuum dried at 50° C. for 40 hours to obtain 187 g of a white polymer. This is made (Polymer 1).

The obtained polymer (Polymer 1) was measured by $^{13}$C, $^{1}$H-NMR and GPC, and the following analytical results were obtained.
Copolymerization composition ratio (Molar ratio)
Hydroxystyrene:4-chlorostyrene:indene=78.0:11.0:11.0
Weight average molecular weight (Mw)=4500
Molecular weight distribution (Mw/Mn)=1.65

Polymer Synthesis Example 2-2

Synthesis of Polymer 2

Under a nitrogen atmosphere, into 3 L of a cylinder for dropping were charged 380.0 g of 4-acetoxystyrene, 70.0 g of 4-chlorostyrene, 50.1 g of acenaphthylene and 59 g of dimethyl-2,2'-azobis-(2-methylpropionate) (V-601 available from Wako Pure Chemical Industries, Ltd.), and 900 g of toluene was added thereto as a solvent to prepare a solution. Into 3 L of a separate flask for polymerization which had been made under a nitrogen atmosphere was charged 300.0 g of toluene, and under the condition that the solvent was heated to 80° C., the solution prepared as mentioned above was added dropwise thereinto over 4 hours. After completion of the dropwise addition, stirring was continued for 18 hours while maintaining the polymerization temperature to 80° C., and then, the mixture was cooled to room temperature. The obtained polymerization liquid was added dropwise to 10 kg of a hexane, and the precipitated copolymer was collected by filtration. The separated copolymer by filtration was washed twice with 2,000 g of a mixed solution of hexane:toluene=10: 1. The obtained copolymer was dissolved in 3 L of a flask under nitrogen atmosphere in a mixed solvent comprising 1,260 g of tetrahydrofuran and 420 g of methanol, and 180 g of ethanolamine was added thereto and the resulting mixture was stirred at 60° C. for 3 hours. The reaction mixture was concentrated under reduced pressure, the resulting concentrate was dissolved in a mixed solvent comprising 3,000 g of ethyl acetate and 800 g of water, the obtained solution was transferred into a separating funnel, and 90 g of acetic acid was added thereto to carry out liquid separating operation. The lower layer was removed, and the obtained organic layer was added 800 g of water and 121 g of pyridine to carry out liquid separating operation. The lower layer was removed, and the obtained organic layer was further added 800 g of water to carry out washing and liquid separating operation (washing and liquid separating operation was five times in total). At the time of allowing to stand at each liquid separating step, when 150 g of acetone was added and the mixture was gently stirred, then, liquid separation was well carried out with good separation.

The organic layer after liquid separation was concentrated, the concentrate was dissolved in 1,200 g of acetone, and the acetone solution passed through 0.02 μm of a Nylon filter was added dropwise to 10 L of water. The obtained crystallized precipitate was collected by filtration and washed with water, and subjected to suction filtration for 2 hours. The mass collected by filtration was dissolved in 1,200 g of acetone again, and the acetone solution passed through 0.02 μm of a Nylon filter was added dropwise to 10 kg of water. The obtained crystallized precipitate was collected by filtration and washed with water, and dried to obtain 400 g of a white polymer. This is made (Polymer 2).

The obtained polymer (Polymer 2) was measured by $^{13}$C-NMR and GPC, and the following analytical results were obtained.

Copolymerization composition ratio (Molar ratio)
Hydroxystyrene:4-chlorostyrene:acenaphthylene=75.0: 15.0:10.0
Weight average molecular weight (Mw)=4100
Molecular weight distribution (Mw/Mn)=1.72

Polymer Synthesis Example 2-3 to 2-10

Syntheses of Polymers 3 to 10

The resins shown in Table 1 were manufactured according to the procedures used in Polymer Synthesis Examples 1 and 2 as a basis except for changing the kind and the formulation ratio of the respective monomers.

The structures of each unit in Table 1 are shown in Tables 2 to 4. Incidentally, in the following Table 1, the introducing ratio shows a molar ratio.

TABLE 1

|  | Unit 1 | Introducing ratio (mole %) | Unit 2 | Introducing ratio (mole %) | Unit 3 | Introducing ratio (mole %) |
|---|---|---|---|---|---|---|
| Polymer 1 | A-1 | 75.0 | B-1 | 15.0 | C-1 | 10.0 |
| Polymer 2 | A-1 | 75.0 | B-1 | 15.0 | C-2 | 10.0 |
| Polymer 3 | A-1 | 79.0 | B-3 | 15.0 | C-1 | 10.0 |
| Polymer 4 | A-1 | 67.0 | B-4 | 15.0 | C-1 | 10.0 |
| Polymer 5 | A-1 | 78.0 | B-1 | 11.0 | C-2 | 11.0 |
| Polymer 6 | A-1 | 78.0 | B-2 | 11.0 | C-2 | 11.0 |
| Polymer 7 | A-2 | 68.0 | B-1 | 22.0 | C-1 | 10.0 |
| Polymer 8 | A-2 | 68.0 | B-3 | 22.0 | C-1 | 10.0 |
| Polymer 9 | A-2 | 66.0 | B-1 | 20.0 | C-3 | 14.0 |
| Polymer 10 | A-2 | 66.0 | B-3 | 20.0 | C-3 | 14.0 |

TABLE 2

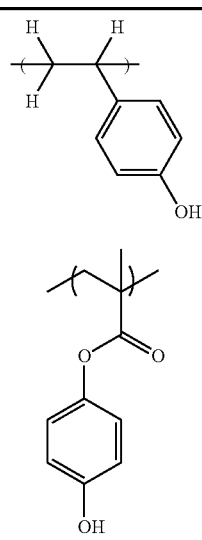

TABLE 3

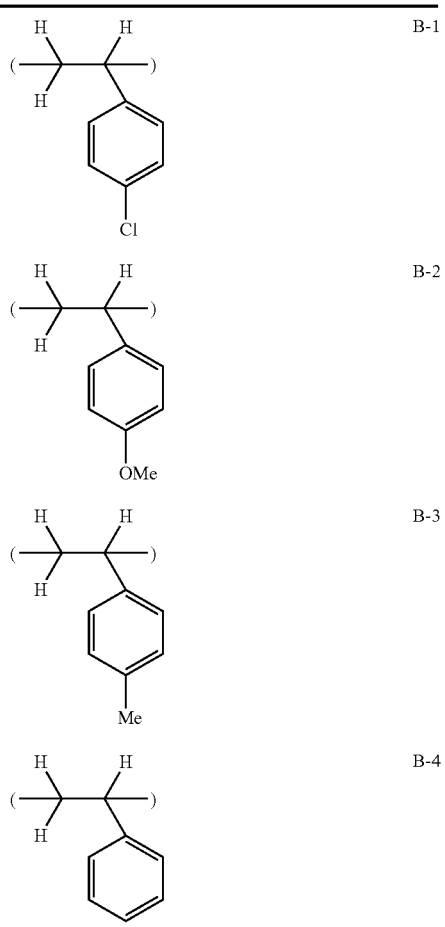

TABLE 4

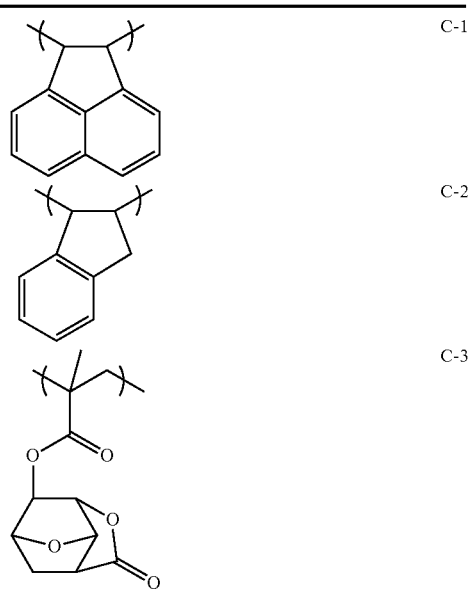

Preparation of Negative Resist Composition

The onium salts (Q-1 to Q-4) synthesized as mentioned above, the onium salts for comparative purpose (Comparative Q-1 to Comparative Q-4), the polymers (Polymer 1 to Polymer 10), photoacid generators, basic compounds and crosslinking agents the structures of which were shown below were dissolved in organic solvents with the compositions shown in Table 6 to prepare respective resist compositions, and further the respective compositions were filtered through a 0.2 μm size filter or a 0.02 μm size Nylon or UPE filter to prepare solutions of negative resist compositions, respectively. The acid generators used have the structures shown by the following PAG-1 and PAG-2, and the basic component used is the compound of the following Base-1. Also, the structures of the used onium salts are shown in the following Table 5.

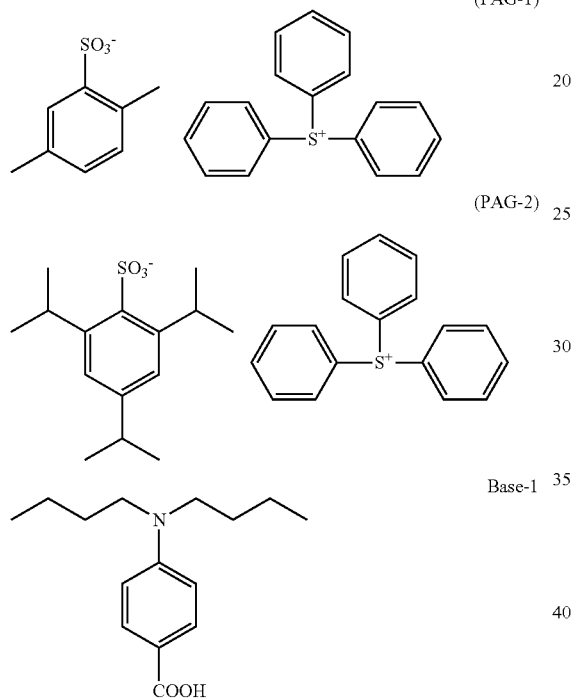

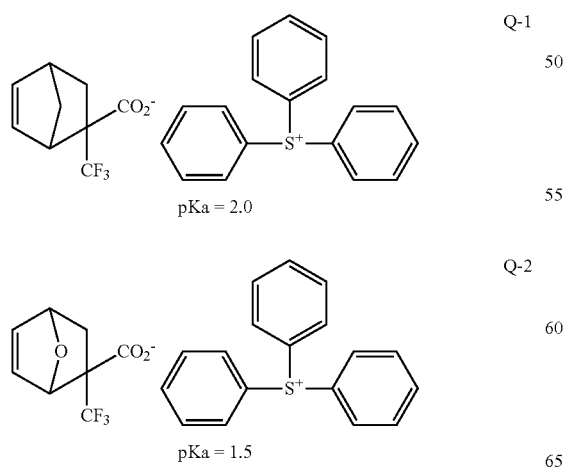

TABLE 5

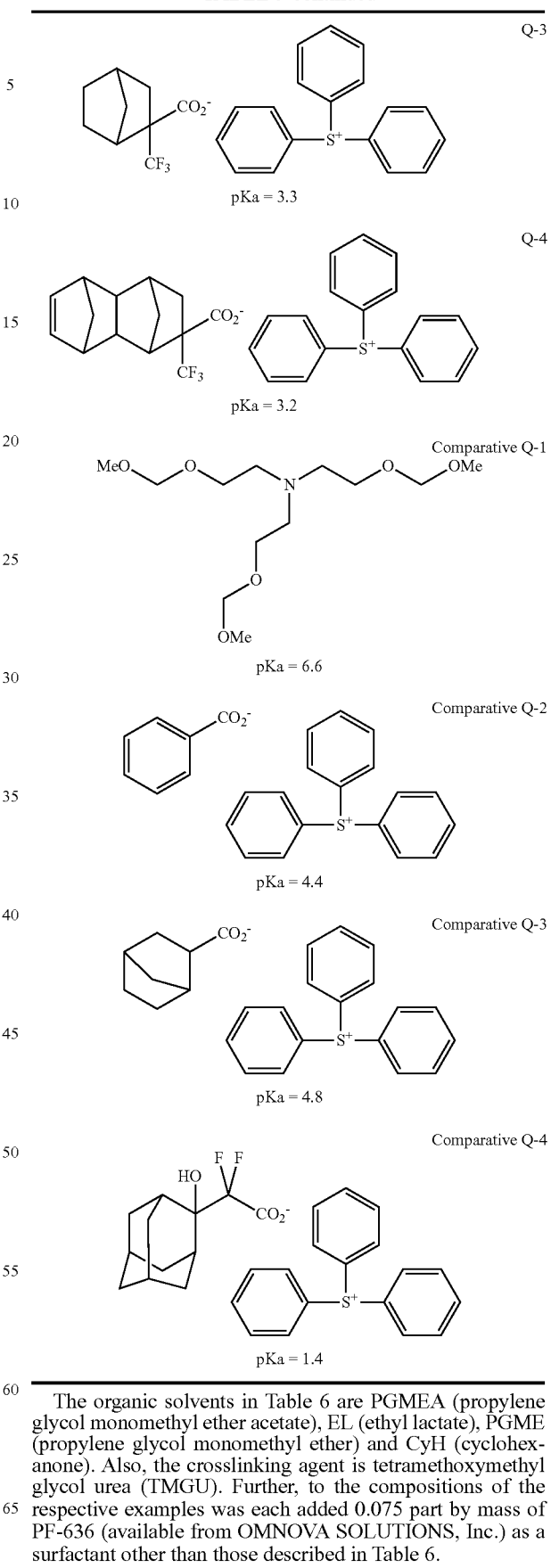

The organic solvents in Table 6 are PGMEA (propylene glycol monomethyl ether acetate), EL (ethyl lactate), PGME (propylene glycol monomethyl ether) and CyH (cyclohexanone). Also, the crosslinking agent is tetramethoxymethyl glycol urea (TMGU). Further, to the compositions of the respective examples was each added 0.075 part by mass of PF-636 (available from OMNOVA SOLUTIONS, Inc.) as a surfactant other than those described in Table 6.

TABLE 6

| | Acid diffusion controller | Resin | Photoacid generator | Cross-linking agent | Solvent 1 | Solvent 2 | Solvent 3 |
|---|---|---|---|---|---|---|---|
| Example 1 | Q-1 (3.6) | Polymer 1 (80) | PAG-1 (8) PAG-2 (2) | TMGU (8.2) | PGMEA (640) | EL (2,170) | — |
| Example 2 | Q-1 (3.0) Comparative Q-1 (0.3) | Polymer 1 (80) | PAG-1 (8) PAG-2 (2) | TMGU (8.2) | PGMEA (640) | EL (2,170) | — |
| Example 3 | Q-1 (3.0) Base-1 (0.3) | Polymer 1 (80) | PAG-1 (8) PAG-2 (2) | TMGU (8.2) | PGMEA (640) | EL (2,170) | — |
| Example 4 | Q-1 (3.0) Comparative Q-1 (0.15) Base-1 (0.15) | Polymer 1 (80) | PAG-1 (8) PAG-2 (2) | TMGU (8.2) | PGMEA (640) | EL (2,170) | — |
| Example 5 | Q-1 (3.6) | Polymer 2 (80) | PAG-1 (8) PAG-2 (2) | TMGU (8.2) | PGMEA (640) | EL (2,170) | — |
| Example 6 | Q-1 (3.6) | Polymer 3 (80) | PAG-1 (8) PAG-2 (2) | TMGU (8.2) | PGMEA (640) | EL (2,170) | — |
| Example 7 | Q-1 (3.6) | Polymer 4 (80) | PAG-1 (8) PAG-2 (2) | TMGU (8.2) | PGMEA (640) | EL (2,170) | — |
| Example 8 | Q-1 (3.6) | Polymer 5 (80) | PAG-1 (8) PAG-2 (2) | TMGU (8.2) | PGMEA (640) | EL (2,170) | — |
| Example 9 | Q-1 (3.0) Base-1 (0.3) | Polymer 5 (80) | PAG-1 (8) PAG-2 (2) | TMGU (8.2) | PGMEA (640) | EL (2,170) | — |
| Example 10 | Q-1 (3.6) | Polymer 6 (80) | PAG-1 (8) PAG-2 (2) | TMGU (8.2) | PGMEA (640) | EL (2,170) | — |
| Example 11 | Q-1 (3.6) | Polymer 7 (80) | PAG-1 (8) PAG-2 (2) | TMGU (8.2) | PGMEA (640) | EL (2,170) | — |
| Example 12 | Q-1 (3.6) | Polymer 8 (80) | PAG-1 (8) PAG-2 (2) | TMGU (8.2) | PGMEA (640) | EL (2,170) | — |
| Example 13 | Q-2 (3.6) | Polymer 1 (80) | PAG-1 (8) PAG-2 (2) | TMGU (8.2) | PGMEA (640) | EL (2,170) | — |
| Example 14 | Q-2 (3.0) Base-1 (0.3) | Polymer 1 (80) | PAG-1 (8) PAG-2 (2) | TMGU (8.2) | PGMEA (640) | EL (2,170) | — |
| Example 15 | Q-2 (3.6) | Polymer 5 (80) | PAG-1 (8) PAG-2 (2) | TMGU (8.2) | PGMEA (640) | EL (2,170) | — |
| Example 16 | Q-2 (3.0) Base-1 (0.3) | Polymer 5 (80) | PAG-1 (8) PAG-2 (2) | TMGU (8.2) | PGMEA (640) | EL (2,170) | — |
| Example 17 | Q-3 (3.6) | Polymer 1 (80) | PAG-1 (8) PAG-2 (2) | TMGU (8.2) | PGMEA (640) | EL (2,170) | — |
| Example 18 | Q-3 (3.0) Base-1 (0.3) | Polymer 1 (80) | PAG-1 (8) PAG-2 (2) | TMGU (8.2) | PGMEA (640) | EL (2,170) | — |
| Example 19 | Q-3 (3.6) | Polymer 5 (80) | PAG-1 (8) PAG-2 (2) | TMGU (8.2) | PGMEA (640) | EL (2,170) | — |
| Example 20 | Q-3 (3.0) Base-1 (0.3) | Polymer 5 (80) | PAG-1 (8) PAG-2 (2) | TMGU (8.2) | PGMEA (640) | EL (2,170) | — |
| Example 21 | Q-4 (3.6) | Polymer 1 (80) | PAG-1 (8) PAG-2 (2) | TMGU (8.2) | PGMEA (640) | EL (2,170) | — |
| Example 22 | Q-4 (3.0) Base-1 (0.3) | Polymer 1 (80) | PAG-1 (8) PAG-2 (2) | TMGU (8.2) | PGMEA (640) | EL (2,170) | — |
| Example 23 | Q-4 (3.6) | Polymer 5 (80) | PAG-1 (8) PAG-2 (2) | TMGU (8.2) | PGMEA (640) | EL (2,170) | — |
| Example 24 | Q-4 (3.0) Base-1 (0.3) | Polymer 5 (80) | PAG-1 (8) PAG-2 (2) | TMGU (8.2) | PGMEA (640) | EL (2,170) | — |
| Example 25 | Q-1 (3.6) | Polymer 9 (80) | PAG-1 (8) PAG-2 (2) | TMGU (8.2) | PGMEA (800) | CyH (1,600) | PGME (400) |
| Example 26 | Q-1 (3.6) | Polymer 10 (80) | PAG-1 (8) PAG-2 (2) | TMGU (8.2) | PGMEA (800) | CyH (1,600) | PGME (400) |
| Comparative Example 1 | Comparative Q-1 (1.7) | Polymer 1 (80) | PAG-1 (8) PAG-2 (2) | TMGU (8.2) | PGMEA (640) | EL (2,170) | — |
| Comparative Example 2 | Comparative Q-1 (1.4) Base-1 (0.3) | Polymer 1 (80) | PAG-1 (8) PAG-2 (2) | TMGU (8.2) | PGMEA (640) | EL (2,170) | — |
| Comparative Example 3 | Comparative Q-2 (2.4) | Polymer 1 (80) | PAG-1 (8) PAG-2 (2) | TMGU (8.2) | PGMEA (640) | EL (2,170) | — |
| Comparative Example 4 | Comparative Q-3 (2.4) | Polymer 1 (80) | PAG-1 (8) PAG-2 (2) | TMGU (8.2) | PGMEA (640) | EL (2,170) | — |
| Comparative Example 5 | Comparative Q-4 (2.5) | Polymer 1 (81) | PAG-1 (8) PAG-2 (3) | TMGU (8.3) | PGMEA (641) | EL (2,171) | — |
| Comparative Example 6 | Comparative Q-1 (1.7) | Polymer 9 (80) | PAG-1 (8) | TMGU (8.2) | PGMEA (800) | CyH (1,600) | PGME (400) |
| Comparative Example 7 | Comparative Q-2 (2.4) | Polymer 9 (80) | PAG-1 (8) | TMGU (8.2) | PGMEA (800) | CyH (1,600) | PGME (400) |

Evaluation of Electron Beam Drawing

Examples 1 to 24 and Comparative Examples 1 to 5

Each of the negative resist composition (Examples 1 to 24 and Comparative Examples 1 to 5) prepared as mentioned above was spin coated onto a 152-mm square mask blank having a chromium oxynitride film at the outermost surface using ACT-M (manufactured by Tokyo Electron Limited), and pre-baked on a hot plate at 110° C. for 600 seconds to form a resist film with a film thickness of 90 nm. The film thickness of the obtained resist film was measured by using an optical film thickness measurement system Nanospec (manufactured by Nanometrics Inc.). Measurement was made at 81 points on surface of the blank substrate excluding an outer edge part within 10 mm inward from the blank periphery, and an average film thickness and a film thickness range were calculated therefrom.

Further, the coated mask blanks were exposed to an electron beam exposure apparatus (EBM-5000 plus, accelerating voltage: 50 keV, manufactured by NuFlare Technology Inc.), then, baked at 90° C. for 600 seconds (PEB: post exposure bake), and developed with a 2.38% by mass of tetramethylammonium hydroxide aqueous solution, whereby negative patterns could be obtained. Further, the obtained resist patterns were evaluated as follows.

The prepared patterned mask blank was observed under a top-down scanning electron microscope (SEM), the exposure dose which provided a 400 nm resolution at a 400 nm 1:1 line and space (LS) pattern and 1:50 isolated space pattern was defined to be the optimum exposure dose ($\mu C/cm^2$), the minimum dimension at the exposure dose was defined to be the resolution (limiting resolution), and with regard to edge roughness, the exposure dose which provided a 1:1 resolution at the top and bottom of a 400 nm 1:1 line and space pattern was defined to be the optimum exposure dose ($\mu C/cm^2$) and the edge roughness with 400 nm LS was measured by SEM. With regard to the pattern profile, it was judged whether it is rectangular or not with naked eyes. In addition, CD uniformity (CDU) was evaluated at 49 points on surface of the blank substrate excluding an outer edge part within 20 mm inward from the blank periphery, by measuring the line width at the exposure dose ($pC/cm^2$) which provided a 1:1 resolution at the top and bottom of a 400 nm 1:1 line and space pattern, and 3σ value of the value in which each measured point was deducted from the average value of the line width was calculated. Evaluation results of the resist compositions of the present invention and the resist compositions for comparison in the electron beam drawing are shown in the following Table 7.

TABLE 7

|  | Optimum Exposure Dose (LS) ($\mu C/cm^2$) | Limiting Resolution (LS) (nm) | Limiting Resolution (IS) (nm) | LER (nm) | CDU (3σ) (nm) | Pattern Profile |
| --- | --- | --- | --- | --- | --- | --- |
| Example 1 | 34 | 40 | 40 | 4.6 | 2.3 | Rectangular |
| Example 2 | 35 | 40 | 40 | 4.8 | 2.2 | Rectangular |
| Example 3 | 34 | 40 | 40 | 4.7 | 2.1 | Rectangular |
| Example 4 | 29 | 40 | 40 | 4.7 | 2.4 | Rectangular |
| Example 5 | 31 | 40 | 40 | 4.8 | 2.5 | Rectangular |
| Example 6 | 32 | 40 | 40 | 4.8 | 2.4 | Rectangular |
| Example 7 | 34 | 40 | 40 | 4.5 | 2.2 | Rectangular |
| Example 8 | 35 | 40 | 40 | 4.5 | 2.5 | Rectangular |
| Example 9 | 32 | 40 | 40 | 4.5 | 2.4 | Rectangular |
| Example 10 | 33 | 40 | 40 | 4.9 | 2.3 | Rectangular |
| Example 11 | 31 | 40 | 40 | 4.8 | 2.2 | Rectangular |
| Example 12 | 33 | 40 | 40 | 4.9 | 2.3 | Rectangular |
| Example 13 | 33 | 40 | 40 | 4.9 | 2.4 | Rectangular |
| Example 14 | 34 | 40 | 40 | 4.8 | 2.2 | Rectangular |
| Example 15 | 34 | 40 | 40 | 4.8 | 2.3 | Rectangular |
| Example 16 | 33 | 40 | 40 | 4.8 | 2.3 | Rectangular |
| Example 17 | 33 | 40 | 40 | 4.8 | 2.4 | Rectangular |
| Example 18 | 34 | 40 | 40 | 4.6 | 2.3 | Rectangular |
| Example 19 | 34 | 40 | 40 | 4.7 | 2.4 | Rectangular |
| Example 20 | 35 | 40 | 40 | 4.9 | 2.4 | Rectangular |
| Example 21 | 35 | 40 | 40 | 4.6 | 2.5 | Rectangular |
| Example 22 | 35 | 40 | 40 | 4.5 | 2.3 | Rectangular |
| Example 23 | 35 | 40 | 40 | 4.8 | 2.4 | Rectangular |
| Example 24 | 35 | 40 | 40 | 4.8 | 2.4 | Rectangular |
| Comparative Example 1 | 34 | 50 | 55 | 6.5 | 3.6 | Rectangular |
| Comparative Example 2 | 34 | 50 | 55 | 6.2 | 3.5 | Rectangular |
| Comparative Example 3 | 34 | 50 | 55 | 5.6 | 3.6 | Rectangular |
| Comparative Example 4 | 34 | 50 | 55 | 5.6 | 3.6 | Rectangular |
| Comparative Example 5 | 12 | 55 | 55 | 7.3 | 3.8 | Rectangular |

Evaluation of EUV Exposure

Examples 25 and 26 and Comparative Examples 6 and 7

The negative resist compositions (Examples 25 and 26 and Comparative Examples 6 and 7) prepared as mentioned above were each spin coated on an Si substrate having a diameter of 4 inches which had been subjected to the hexamethyldisilazane (HMDS) vapor prime treatment, and pre-baked on a hot plate at 105° C. for 60 seconds to form a resist film with a thickness of 50 nm. This was subjected to EUV exposure with NA0.3 and dipole illumination.

The coated substrate was subjected to post-exposure bake (PEB) for 60 seconds on a hot plate immediately after exposure and to paddle development with 2.38% by mass of TMAH aqueous solution for 80 seconds, whereby the positive pattern was obtained.

The obtained resist pattern was evaluated as follows. The minimum dimension at the exposure dose which provided a 1:1 resolution of a 100 nm LS pattern was defined to be the resolution (limiting resolution), and the edge roughness (LER) of 100 nm LS pattern was measured by SEM. With regard to the pattern profile, it was judged whether it is rectangular or not with naked eyes. Evaluation results of the resist compositions of the present invention and the resist compositions for comparison in the EUV drawing are shown in Table 8.

TABLE 8

| | Optimum Exposure Dose (mJ/cm$^2$) | Limiting Resolution (nm) | LER (nm) | Pattern Profile |
|---|---|---|---|---|
| Example 25 | 24 | 28 | 4.0 | Rectangular |
| Example 26 | 23 | 30 | 4.3 | Rectangular |
| Comparative Example 6 | 22 | 35 | 7.0 | Rectangular |
| Comparative Example 7 | 23 | 35 | 6.5 | Rectangular |

The results in the above-mentioned Tables 7 and 8 are explained. The chemically amplified negative resist composition of the present invention (Examples 1 to 24, and Examples 25 and 26) each showed good resolution and good pattern rectangularity, and also showed good values in line edge roughness. On the other hand, the resist compositions using the amine compound in place of the onium salt to be used in the present invention or the resist compositions using the onium salt having no fluorine atom at the α-position of the carboxyl group of Comparative Examples 1 to 5 and Comparative Examples 6 and 7 showed bad results in resolution, line edge roughness and CDU as compared with those of Examples. When the amine compound was used, the acid generated from the sulfonic acid could not cause the exchange reaction with the amine compound, so that properties were considered to become worse. Also, the resist compositions using the onium salt having no fluorine atom-containing group at the α-position of the carboxyl group had a large difference in a pKa from that of the sulfonic acid, so that the cause of deterioration of roughness was considered to be a rapid exchange reaction which did not occur. In addition, when the onium salt having a pKa smaller than 1.5 was used in Comparative Example 5, the resist was highly sensitive, and the value of the line edge roughness became large. This result can be considered that the pKa is high so that it did not act as the acid diffusion controlling agent but act as the acid generator.

As can be clearly seen from the explanation mentioned above, when the resist composition of the present invention is employed, a pattern with a little line edge roughness can be formed by exposure. The patterning process using the same is useful for photolithography in semiconductor manufacturing, in particular, in the processing of photomask blanks.

It must be stated here that the present invention is not restricted to the embodiments shown by the above-mentioned embodiments. The above-mentioned embodiments are merely examples so that any embodiments composed of substantially the same technical concept as disclosed in the claims of the present invention and expressing a similar effect are included in the technical scope of the present invention.

What is claimed is:

1. A chemically amplified negative resist composition which comprises an onium salt represented by the following general formula (0-1), a resin which becomes alkali insoluble by an action of an acid and an acid generator,

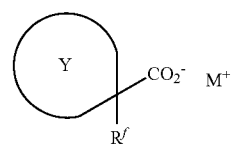

(0-1)

wherein R$^f$ represents a fluorine atom or a trifluoromethyl group; Y represents a cyclic hydrocarbon group having 3 to 30 carbon atoms, the hydrogen atom in the cyclic hydrocarbon group may be substituted by a hetero atom itself or a monovalent hydrocarbon group which may be substituted by a hetero atom(s), and the hetero atom(s) may be interposed into the cyclic structure of the cyclic hydrocarbon group and the monovalent hydrocarbon group; and M$^+$ represents a monovalent cation.

2. The chemically amplified negative resist composition according to claim 1, wherein the onium salt is represented by the following general formula (1) or (2),

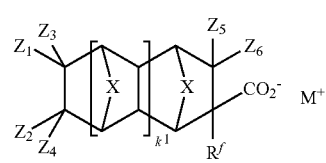

(1)

wherein R$^f$ and M$^+$ have the same meanings as defined above; X represents O or CH$_2$; k$^1$ represents an integer of 0 to 2; and each Z$^1$, Z$^2$, Z$^3$, Z$^4$, Z$^5$ and Z$^6$ independently represent a hydrogen atom or a linear, branched or cyclic monovalent hydrocarbon group having 1 to 10 carbon atoms which may be substituted by a hetero atom(s), and a hetero atom(s) may be interposed in the monovalent hydrocarbon group,

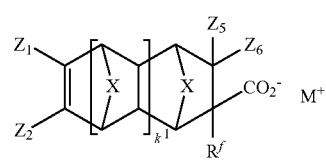

(2)

wherein R$^f$, X, k$^1$, Z$^1$, Z$^2$, Z$^5$, Z$^6$ and M$^+$ have the same meanings as defined above.

3. The chemically amplified negative resist composition according to claim 1, wherein the resin contains a repeating unit represented by the following general formula (3) or a repeating unit represented by the following general formula (4), or both of them,

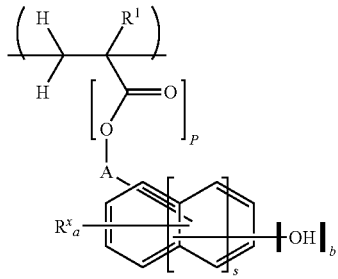
(3)

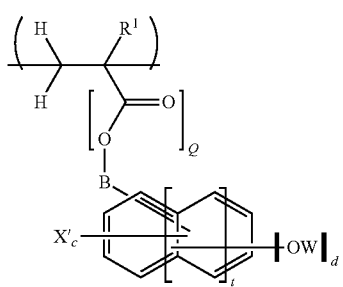
(4)

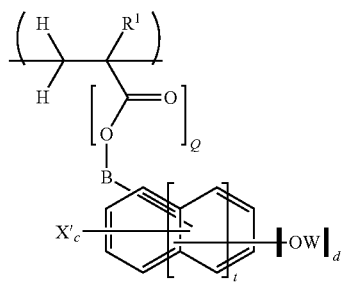
(4)

wherein each A and B represent a single bond or an alkylene group having 1 to 10 carbon atoms which may contain an ether bond(s) in the chain of the alkylene group; each $R^1$ independently represents a hydrogen atom or a methyl group; each $R^X$ independently represents a hydrogen atom or an alkyl group having 1 to 6 carbon atoms; X' represents a hydrogen atom, a linear, branched or cyclic alkyl group having 1 to 20 carbon atoms, an alkoxyalkyl group having 2 to 20 carbon atoms, an alkylthioalkyl group having 2 to 20 carbon atoms, a halogen atom, a nitro group, a cyano group, a sulfinyl group or a sulfonyl group; W represents an alkyl group having 1 to 20 carbon atoms or an acyl group having 1 to 20 carbon atoms; "a" and "c" represent integers of 0 to 4; "b" represents an integer of 1 to 5; "d" represents an integer of 0 to 5; each P and Q represent 0 or 1; and each "s" and "t" represent an integer of 0 to 2.

4. The chemically amplified negative resist composition according to claim 2, wherein the resin contains a repeating unit represented by the following general formula (3) or a repeating unit represented by the following general formula (4), or both of them,

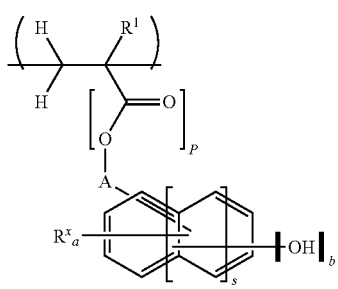
(3)

wherein each A and B represent a single bond or an alkylene group having 1 to 10 carbon atoms which may contain an ether bond(s) in the chain of the alkylene group; each $R^1$ independently represents a hydrogen atom or a methyl group; each $R^X$ independently represents a hydrogen atom or an alkyl group having 1 to 6 carbon atoms; X' represents a hydrogen atom, a linear, branched or cyclic alkyl group having 1 to 20 carbon atoms, an alkoxyalkyl group having 2 to 20 carbon atoms, an alkylthioalkyl group having 2 to 20 carbon atoms, a halogen atom, a nitro group, a cyano group, a sulfinyl group or a sulfonyl group; W represents an alkyl group having 1 to 20 carbon atoms or an acyl group having 1 to 20 carbon atoms; "a" and "c" represent integers of 0 to 4; "b" represents an integer of 1 to 5; "d" represents an integer of 0 to 5; each P and Q represent 0 or 1; and each "s" and "t" represent an integer of 0 to 2.

5. The chemically amplified negative resist composition according to claim 1, wherein the resin contains a repeating unit represented by the following general formula (5) or a repeating unit represented by the following general formula (6), or both of them,

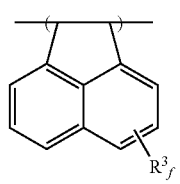
(5)

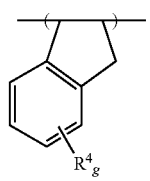
(6)

wherein "f" represents an integer of 0 to 6; each $R^3$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s); "g" represents an integer of 0 to 4; each $R^4$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s).

6. The chemically amplified negative resist composition according to claim 2, wherein the resin contains a repeating unit represented by the following general formula (5) or a repeating unit represented by the following general formula (6), or both of them,

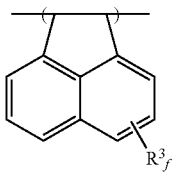

(5)

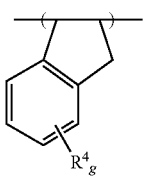

(6)

wherein "f" represents an integer of 0 to 6; each $R^3$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s); "g" represents an integer of 0 to 4; each $R^4$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s).

7. The chemically amplified negative resist composition according to claim 3, wherein the resin contains a repeating unit represented by the following general formula (5) or a repeating unit represented by the following general formula (6), or both of them,

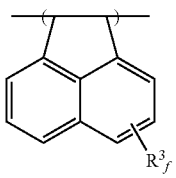

(5)

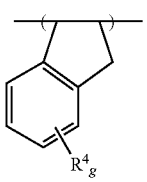

(6)

wherein "f" represents an integer of 0 to 6; each $R^3$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s); "g" represents an integer of 0 to 4; each $R^4$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s).

8. The chemically amplified negative resist composition according to claim 4, wherein the resin contains a repeating unit represented by the following general formula (5) or a repeating unit represented by the following general formula (6), or both of them,

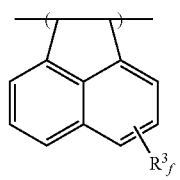

(5)

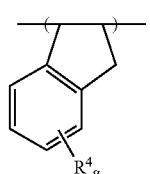

(6)

wherein "f" represents an integer of 0 to 6; each $R^3$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s); "g" represents an integer of 0 to 4; each $R^4$ independently represents a hydrogen atom, an alkyl group having 1 to 6 carbon atoms which may be substituted by a halogen atom(s), a primary or secondary alkoxy group which may be substituted by a halogen atom(s) or an alkylcarbonyloxy group having 1 to 7 carbon atoms which may be substituted by a halogen atom(s).

9. The chemically amplified negative resist composition according to claim 1, wherein the composition further contains a crosslinking agent.

10. The chemically amplified negative resist composition according to claim 2, wherein the composition further contains a crosslinking agent.

11. The chemically amplified negative resist composition according to claim 3, wherein the composition further contains a crosslinking agent.

12. The chemically amplified negative resist composition according to claim 4, wherein the composition further contains a crosslinking agent.

13. The chemically amplified negative resist composition according to claim 1, wherein the composition further contains one or more basic compounds represented by the following general formulae (7) to (9),

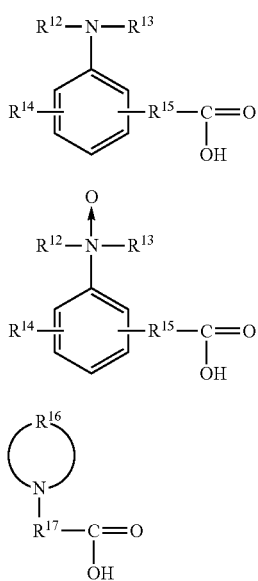

(7)

(8)

(9)

wherein each $R^{12}$ and $R^{13}$ represent a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, or $R^{12}$ and $R^{13}$ may be bonded to form a cyclic structure with the nitrogen atom to which they are bonded; $R^{14}$ represents a hydrogen atom, a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, branched or cyclic alkylene group having 1 to 20 carbon atoms, or an arylene group having 6 to 20 carbon atoms; $R^{16}$ represents a linear or branched alkylene group having 2 to 20 carbon atoms which may be substituted, and the alkylene group may contain one or a plural number of a carbonyl group(s), an ether group(s), an ester group(s) and a sulfide bond(s) between carbon-carbon bond of the alkylene group; and $R^{17}$ represents a linear, branched or cyclic alkylene group having 1 to 20 carbon atoms, or an arylene group having 6 to 20 carbon atoms.

14. The chemically amplified negative resist composition according to claim 2, wherein the composition further contains one or more basic compounds represented by the following general formulae (7) to (9),

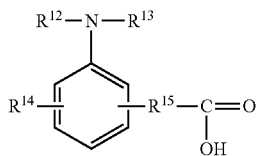

(7)

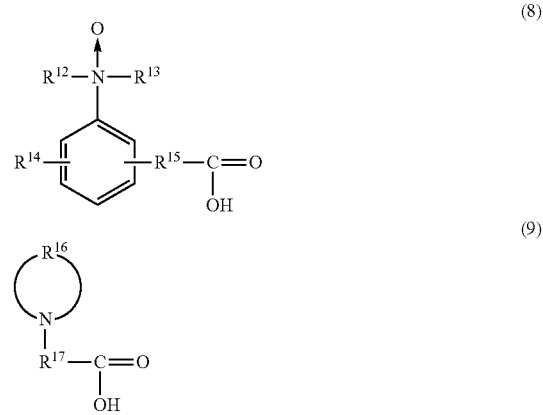

wherein each $R^{12}$ and $R^{13}$ represent a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, or $R^{12}$ and $R^{13}$ may be bonded to form a cyclic structure with the nitrogen atom to which they are bonded; $R^{14}$ represents a hydrogen atom, a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, branched or cyclic alkylene group having 1 to 20 carbon atoms, or an arylene group having 6 to 20 carbon atoms; $R^{16}$ represents a linear or branched alkylene group having 2 to 20 carbon atoms which may be substituted, and the alkylene group may contain one or a plural number of a carbonyl group(s), an ether group(s), an ester group(s) and a sulfide bond(s) between carbon-carbon bond of the alkylene group; and $R^{17}$ represents a linear, branched or cyclic alkylene group having 1 to 20 carbon atoms, or an arylene group having 6 to 20 carbon atoms.

15. The chemically amplified negative resist composition according to claim 3, wherein the composition further contains one or more basic compounds represented by the following general formulae (7) to (9),

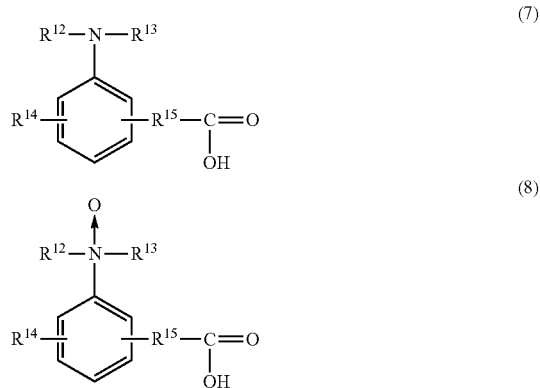

-continued

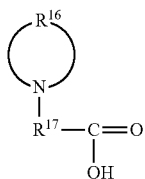

(9)

wherein each $R^{12}$ and $R^{13}$ represent a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, or $R^{12}$ and $R^{13}$ may be bonded to form a cyclic structure with the nitrogen atom to which they are bonded; $R^{14}$ represents a hydrogen atom, a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, branched or cyclic alkylene group having 1 to 20 carbon atoms, or an arylene group having 6 to 20 carbon atoms; $R^{16}$ represents a linear or branched alkylene group having 2 to 20 carbon atoms which may be substituted, and the alkylene group may contain one or a plural number of a carbonyl group(s), an ether group(s), an ester group(s) and a sulfide bond(s) between carbon-carbon bond of the alkylene group; and $R^{17}$ represents a linear, branched or cyclic alkylene group having 1 to 20 carbon atoms, or an arylene group having 6 to 20 carbon atoms.

16. The chemically amplified negative resist composition according to claim 4, wherein the composition further contains one or more basic compounds represented by the following general formulae (7) to (9),

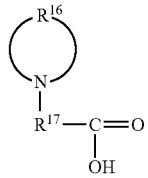

(9)

wherein each $R^{12}$ and $R^{13}$ represent a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, or an alkylthioalkyl group having 2 to 20 carbon atoms, or $R^{12}$ and $R^{13}$ may be bonded to form a cyclic structure with the nitrogen atom to which they are bonded; $R^{14}$ represents a hydrogen atom, a linear, branched or cyclic alkyl group having 1 to 20 carbon atoms, an aryl group having 6 to 20 carbon atoms, an aralkyl group having 7 to 20 carbon atoms, a hydroxyalkyl group having 2 to 20 carbon atoms, an alkoxyalkyl group having 2 to 20 carbon atoms, an acyloxyalkyl group having 2 to 20 carbon atoms, an alkylthioalkyl group having 2 to 20 carbon atoms, or a halogen atom; $R^{15}$ represents a single bond, a linear, branched or cyclic alkylene group having 1 to 20 carbon atoms, or an arylene group having 6 to 20 carbon atoms; $R^{16}$ represents a linear or branched alkylene group having 2 to 20 carbon atoms which may be substituted, and the alkylene group may contain one or a plural number of a carbonyl group(s), an ether group(s), an ester group(s) and a sulfide bond(s) between carbon-carbon bond of the alkylene group; and $R^{17}$ represents a linear, branched or cyclic alkylene group having 1 to 20 carbon atoms, or an arylene group having 6 to 20 carbon atoms.

17. A patterning process which comprises the steps of forming a resist film on a workpiece using the chemically amplified negative resist composition according to claim 1, irradiating a high energy beam to the resist film, and developing the resist film after irradiation using an alkaline developer to obtain a resist pattern.

18. The patterning process according to claim 17, wherein EUV or an electron beam is used as the high energy beam.

19. The patterning process according to claim 17, wherein a substrate having a layer containing chromium at an outermost layer thereof is used as the workpiece.

20. The patterning process according to claim 17, wherein a photomask blank is used as the workpiece.

* * * * *